United States Patent
Yatago et al.

(10) Patent No.: US 11,569,373 B2
(45) Date of Patent: Jan. 31, 2023

(54) SEMICONDUCTOR DEVICE AND METHOD FOR MANUFACTURING SEMICONDUCTOR DEVICE

(71) Applicants: Masatoshi Yatago, Tokyo (JP); Naohiro Shiraishi, Tokyo (JP); Katsunori Kondo, Tokyo (JP); Noriyoshi Watanabe, Tokyo (JP)

(72) Inventors: Masatoshi Yatago, Tokyo (JP); Naohiro Shiraishi, Tokyo (JP); Katsunori Kondo, Tokyo (JP); Noriyoshi Watanabe, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 30 days.

(21) Appl. No.: 17/337,662

(22) Filed: Jun. 3, 2021

(65) Prior Publication Data
US 2021/0399118 A1    Dec. 23, 2021

(30) Foreign Application Priority Data

Jun. 18, 2020    (JP) .............................. JP2020-105121

(51) Int. Cl.
*H01L 29/739*    (2006.01)
*H01L 29/06*    (2006.01)
(Continued)

(52) U.S. Cl.
CPC ...... *H01L 29/7397* (2013.01); *H01L 29/0696* (2013.01); *H01L 29/1095* (2013.01);
(Continued)

(58) Field of Classification Search
CPC ............. H01L 29/7397; H01L 29/0696; H01L 29/1095; H01L 29/407; H01L 29/6634; H01L 29/66348
(Continued)

(56) References Cited

U.S. PATENT DOCUMENTS 5,751,024 A    5/1998    Takahashi
7,986,003 B2    7/2011    Aono et al.
(Continued)

FOREIGN PATENT DOCUMENTS

EP    2546882    1/2013
JP    3288218    6/2002
(Continued)

OTHER PUBLICATIONS

Extended European Search Report dated Oct. 25, 2021 with respect to the corresponding European patent application No. 21179296.5.

*Primary Examiner* — Igwe U Anya
(74) *Attorney, Agent, or Firm* — IPUSA, PLLC

(57) ABSTRACT

A semiconductor device includes first and second trenches, and a first layer provided therebetween, in a principal surface of a semiconductor substrate, a second layer in contact with and sandwiching the first trench with the first layer, a third layer provided under the second layer and in contact with the second layer and the first trench, a fourth layer provided under and in contact with the third layer but separated from the first trench, and a fifth layer provided in the principal surface and sandwiching the second trench with the first layer. The second and fourth layers are semiconductors of a first conductivity type, and the first, third, and fifth layers are semiconductors of a second conductivity type. A gate trench electrode is provided inside the first trench via the insulating film, and an emitter trench electrode is provided inside the second trench via the insulating film.

14 Claims, 17 Drawing Sheets

(51) Int. Cl.
*H01L 29/10* (2006.01)
*H01L 29/40* (2006.01)
*H01L 29/66* (2006.01)

(52) U.S. Cl.
CPC ........ *H01L 29/407* (2013.01); *H01L 29/6634* (2013.01); *H01L 29/66348* (2013.01)

(58) Field of Classification Search
USPC ........................................................ 257/139
See application file for complete search history.

(56) References Cited

U.S. PATENT DOCUMENTS

| | | | |
|---|---|---|---|
| 2012/0146091 A1* | 6/2012 | Tanabe | H01L 29/66348 257/E29.197 |
| 2012/0181575 A1 | 7/2012 | Pfirsch | |
| 2015/0349103 A1 | 12/2015 | Onozawa et al. | |
| 2017/0054010 A1* | 2/2017 | Matsuura | H01L 29/1095 |

FOREIGN PATENT DOCUMENTS

| | | | |
|---|---|---|---|
| JP | 5089191 | | 12/2012 |
| JP | 2014-063961 | | 4/2014 |
| JP | 2014063961 A | * | 4/2014 |
| WO | 2015/022989 | | 2/2015 |

* cited by examiner

SEMICONDUCTOR DEVICE AND METHOD FOR MANUFACTURING SEMICONDUCTOR DEVICE

CROSS-REFERENCE TO RELATED APPLICATIONS

This application is based on and claims priority to Japanese Patent Application No. 2020-105121 filed on Jun. 18, 2020, the entire contents of which are incorporated herein by reference.

BACKGROUND OF THE INVENTION

1. Field of the Invention

The present disclosure relates to semiconductor devices, and methods for manufacturing semiconductor devices.

2. Description of the Related Art

Among insulated gate bipolar transistors (IGBTs), there is a known semiconductor device provided with a high-concentration N-type semiconductor layer which is disposed under a P-type channel region and is in contact with the entire lower surface of the P-type channel region, such as that proposed in Japanese Laid-Open Patent Publication No. H08-316479 (now Japanese Patent No. 3288218), for example. A saturation voltage can be reduced by providing the high-concentration N-type semiconductor layer.

An example of a method for manufacturing the IGBT is proposed in Japanese Laid-Open Patent Publication No. 2008-205015 (now Japanese Patent No. 5089191), for example.

In conventional semiconductor devices having the high-concentration N-type semiconductor layer, characteristics, such as a threshold voltage or the like of a metal oxide semiconductor (MOS) structure of the IGBT, may easily vary.

SUMMARY OF THE INVENTION

One object of the present disclosure is to provide a semiconductor device, and a method for manufacturing the semiconductor device, which can easily adjust the saturation voltage, and reduce the variation in the characteristics.

According to one aspect of embodiments of the present disclosure, a semiconductor device includes a semiconductor substrate of a first conductivity type, having a first principal surface, and a second principal surface on an opposite side from the first principal surface; a first trench provided in the first principal surface; a second trench provided in the first principal surface; a first semiconductor layer of a second conductivity type, provided in the first principal surface between the first trench and the second trench; a second semiconductor layer of the first conductivity type, provided in the first principal surface at a position sandwiching the first trench between the second semiconductor layer and the first semiconductor layer, and making contact with the first trench; a third semiconductor layer of the second conductivity type, provided under the second semiconductor layer, and making contact with the second semiconductor layer and the first trench; a fourth semiconductor layer of the first conductivity type, provided under the third semiconductor layer, and making contact with the third semiconductor layer but separated from the first trench; a fifth semiconductor layer of the second conductivity type, provided in the first principal surface at a position sandwiching the second trench between the fifth semiconductor layer and the first semiconductor layer; a first insulating film provided on an inner wall of the first trench; a first gate trench electrode provided inside the first trench via the first insulating film, and opposing the third semiconductor layer; a second insulating film provided on an inner wall of the second trench; a first emitter trench electrode provided inside the second trench via the second insulating film; a gate electrode connected to the first gate trench electrode; an emitter electrode connected to the first emitter trench electrode, the second semiconductor layer, the third semiconductor layer, and the fifth semiconductor layer; and a collector electrode provided in the second principal surface, wherein the first semiconductor layer is in an electrically floating state.

According to another aspect of the embodiments of the present disclosure, a method for manufacturing a semiconductor device, includes forming a first trench and a second trench in a first principal surface of a semiconductor substrate of a first conductivity type having the first principal surface and a second principal surface on an opposite side from the first principal surface; forming a first semiconductor layer of a second conductivity type in the first principal surface between the first trench and the second trench; forming a second semiconductor layer of the first conductivity type in the first principal surface, making contact with the first trench, at a position sandwiching the first trench between the second semiconductor layer and the first semiconductor layer; forming a third semiconductor layer of the second conductivity type under the second semiconductor layer, making contact with the second semiconductor layer and the first trench; forming a fourth semiconductor layer of the first conductivity type under the third semiconductor layer, making contact with the third semiconductor layer but separated from the first trench; forming a fifth semiconductor layer of the second conductivity type in the first principal surface at a position sandwiching the second trench between the fifth semiconductor layer and the first semiconductor layer; forming a first insulating film on an inner wall of the first trench; forming a first gate trench electrode inside the first trench via the first insulating film, and opposing the third semiconductor layer; forming a second insulating film on an inner wall of the second trench; forming a first emitter trench electrode inside the second trench via the second insulating film; forming a gate electrode connected to the first gate trench electrode; forming an emitter electrode connected to the first emitter trench electrode, the second semiconductor layer, the third semiconductor layer, and the fifth semiconductor layer; and forming a collector electrode in the second principal surface, wherein the first semiconductor layer is in an electrically floating state.

Other objects and further features of the present invention will be apparent from the following detailed description when read in conjunction with the accompanying drawings.

DESCRIPTION OF THE PREFERRED EMBODIMENTS

Figure 1:
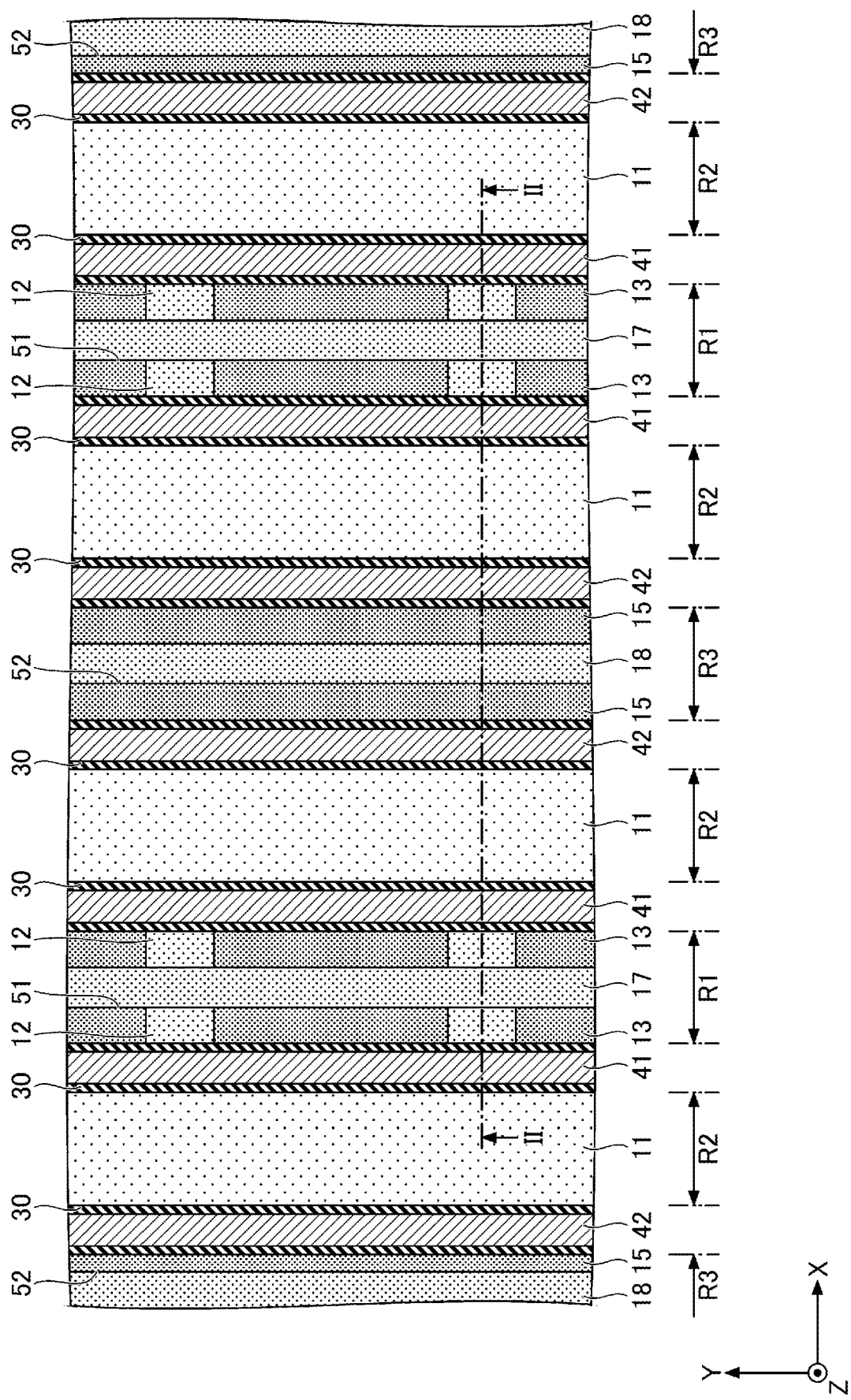
FIG. 1 is a diagram illustrating a layout of semiconductor layers and trench electrodes in a semiconductor device according to a first embodiment.

Embodiments of a semiconductor device, and a method for manufacturing the semiconductor device according to the present disclosure will be described, by referring to the drawings. In the drawings, those constituent elements having substantially the same functions and/or structure are designated by the same reference numerals, and a repeated description of substantially the same constituent elements may be omitted. In the following description, two directions, which are parallel to a surface of a substrate and are perpendicular to each other, are regarded as an X-direction and a Y-direction, and a direction perpendicular to the surface of the substrate is regarded as a Z-direction.

First Embodiment

Figure 2:
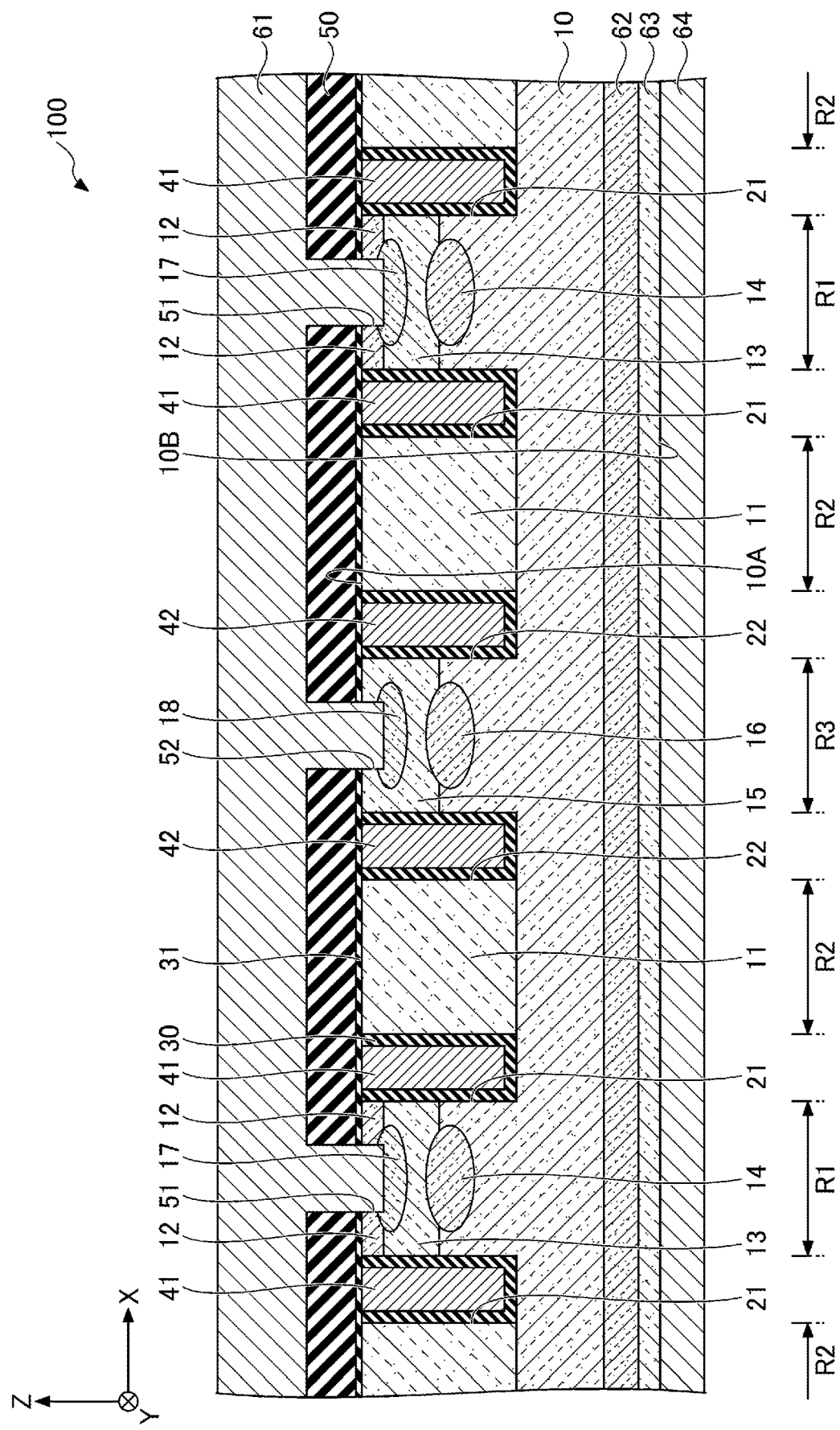
FIG. 2 is a cross sectional view illustrating the semiconductor device according to the first embodiment.

A first embodiment will first be described. The first embodiment relates to a semiconductor device including an insulated gate bipolar transistor (IGBT). FIG. 1 is a diagram illustrating a layout of semiconductor layers and trench electrodes in the semiconductor device according to the first embodiment. FIG. 2 is a cross sectional view illustrating the semiconductor device according to the first embodiment. FIG. 2 corresponds to the cross sectional view along a line II-II in FIG. 1.

A semiconductor device 100 according to a first embodiment includes an N-type semiconductor substrate 10 having a first principal surface 10A, and a second principal surface 10B on an opposite side from the first principal surface 10A, as illustrated in FIG. 2. The semiconductor substrate 10 may be a silicon substrate, for example. A plurality of gate trenches 21, and a plurality of emitter trenches 22, are formed in the first principal surface 10A. The trenches 21 and 22 extend in the Y-direction, for example. Two trenches 21 form a pair, and two trenches 22 form a pair, for example, and the pair of trenches 21 and the pair of trenches 22 are alternately arranged in the X-direction. A distance between two trenches 21 that are adjacent to each other in the X-direction, a distance between two trenches 22 that are adjacent to each other in the X-direction, and a distance between the trenches 21 and 22 that are adjacent to each other in the X-direction, are the same. That is, if the trenches 21 and 22 are not distinguished from each other, the plurality of trenches are equally spaced in the X-direction and formed in a stripe shape in the first principal surface 10A. A first region R1 is defined between two trenches 21 that are adjacent to each other in the X-direction, a second region R2 is defined between the trench 21 and the trench 22 that are adjacent to each other in the X-direction, and a third region R3 is defined between two trenches 22 that are adjacent to each other in the X-direction. In the first embodiment, the first region R1 and the third region R3 are alternately disposed in the X-direction, with one second region R2 interposed between the first region R1 and the third region R3, such that the third region R3, the second region R2, the first region R1, the second region R2, the third region R3, the second region R2, the first region R1, . . . , are arranged in the X-direction.

In the first region R1, an N-type semiconductor layer 12 is provided in the first principal surface 10A. The N-type semiconductor layer 12 includes a higher concentration of N-type impurity than the semiconductor substrate 10. The N-type semiconductor layer 12 is exposed at the first principal surface 10A, and makes contact with the trench 21. A P-type semiconductor layer 13 is provided under the N-type semiconductor layer 12. The P-type semiconductor layer 13 makes contact with the N-type semiconductor layer 12 and the trench 21. In the Z-direction, a lower end of the P-type semiconductor layer 13 is located at a position above a lower end of the trench 21. A P-type semiconductor layer 17 is formed near an interface of the P-type semiconductor layer 13 with the N-type semiconductor layer 12. The P-type semiconductor layer 17 may be formed over a span of the N-type semiconductor layer 12 and the P-type semiconductor layer 13, or may be formed to include the interface between the N-type semiconductor layer 12 and the P-type semiconductor layer 13. The P-type semiconductor layer 17 is separated from the trench 21. The P-type semiconductor layer 17 includes a higher concentration of P-type impurity than the P-type semiconductor layer 13. In the Z-direction, a lower end of the P-type semiconductor layer 17 is located at a position above the lower end of the P-type semiconductor layer 13. An N-type semiconductor layer 14 is provided under the P-type semiconductor layer 13. The N-type semiconductor layer 14 includes a higher concentration of N-type impurity than the semiconductor substrate 10, but includes a lower concentration of N-type impurity than the N-type semiconductor layer 12. The N-type semiconductor layer 14 makes contact with the P-type semiconductor layer 13, and is separated from the trench 21.

In the second region R2, a P-type semiconductor layer 11 is provided in the first principal surface 10A. The P-type semiconductor layer 11 makes contact with the trench 21 and the trench 22. For example, in the Z-direction, a lower end of the P-type semiconductor layer 11 is located at a position above the lower end of the trench 21. For example, a depth of the P-type semiconductor layer 11 is greater than or equal to a depth of the trench 21. The P-type semiconductor layer 11 includes a lower concentration of P-type impurity than the P-type semiconductor layer 13.

In the third region R3, a P-type semiconductor layer 15 is provided in the first principal surface 10A. For example, the P-type semiconductor layer 15 includes a concentration of P-type impurity approximately the same as the concentration of P-type impurity of the P-type semiconductor layer 13. The P-type semiconductor layer 15 is exposed at the first principal surface 10A, and makes contact with the trench 22. For example, in the Z-direction, a lower end of the P-type semiconductor layer 15 may be located at the same position as the lower end of the P-type semiconductor layer 13, or may be located at a position under the lower end of the P-type semiconductor layer 13. For example, in the Z-direction, the lower end of the P-type semiconductor layer 15 may be located at the same position as the lower end of the P-type semiconductor layer 11, or may be located at a position above the lower end of the P-type semiconductor layer 11. A depth of the P-type semiconductor layer 15 may be equal to the depth of the P-type semiconductor layer 13, or may be greater than the depth of the P-type semiconductor layer 13, and less than or equal to the depth of the P-type semiconductor layer 11. A P-type semiconductor layer 18 is formed inside the P-type semiconductor layer 15. The P-type semiconductor layer 18 includes a higher concentration of P-type impurity than the P-type semiconductor layer 15. For example, the P-type semiconductor layer 18 includes a concentration of P-type impurity approximately the same as the concentration of P-type impurity of the P-type semiconductor layer 17. An N-type semiconductor layer 16 is provided under the P-type semiconductor layer 15. The N-type semiconductor layer 16 includes a higher concentration of N-type impurity than the semiconductor substrate 10. For example, the N-type semiconductor layer 16 includes a concentration of N-type impurity approximately the same as the concentration of N-type impurity of the N-type semiconductor layer 14. At least a portion of the N-type semiconductor layer 16 overlaps the P-type semiconductor layer 15, abuts the P-type semiconductor layer 15, and is separated from the trench 22.

An insulating film 30 is provided on inner walls of the trenches 21 and 22. An insulating film 31 is provided on the first principal surface 10A. That is, the insulating film 31 covers the P-type semiconductor layer 11 and the N-type semiconductor layer 12. The insulating films 30 and 31 are thermal oxidation films, for example. Inside the trench 21, a gate trench electrode 41 is provided via the insulating film 30. The gate trench electrode 41 opposes the P-type semiconductor layer 13 via the insulating film 30. Inside the trench 22, an emitter trench electrode 42 is provided via the insulating film 30. The gate trench electrode 41 and the emitter trench electrode 42 may be formed using polysilicon, for example. The insulating film 31 is also formed on the gate trench electrode 41 and the emitter trench electrode 42.

A portion of the insulating film 30 inside the trench 21 functions as a gate insulator. In the first region R1, the N-type semiconductor layer 12, the P-type semiconductor layer 13, and the N-type semiconductor substrate 10 are aligned along the insulating film 30 inside the trench 21, and the P-type semiconductor layer 13 functions as a channel region. That is, a metal oxide semiconductor (MOS) structure is formed by the first region R1, the insulating film 30, and the gate trench electrode 41.

An interlayer insulator 50 is provided on the insulating film 31. The interlayer insulator 50 is a borophosphosilicate glass (BPSG) film, for example. Openings 51 reaching the P-type semiconductor layer 17 are formed in the interlayer insulator 50, the insulating film 31, and the N-type semiconductor layer 12. The N-type semiconductor layer 12 is divided into two by the openings 51. An opening 52 reaching the P-type semiconductor layer 18 is formed in the interlayer insulator 50, the insulating film 31, and the P-type semiconductor layer 15. An emitter electrode (or emitter pad) 61 is provided on the interlayer insulator 50. The emitter electrode 61 makes contact with the N-type semiconductor layer 12 and the P-type semiconductor layer 13, through the openings 51, and makes contact with the P-type semiconductor layers 15 and 18 through the opening 52. The emitter electrode 61 may be formed using aluminum, for example.

A P-type semiconductor layer 63 is provided on the second principal surface 10B, and an N-type semiconductor layer 62 is provided above the P-type semiconductor layer 63. The N-type semiconductor layer 62 makes contact with the P-type semiconductor layer 63. The N-type semiconductor layer 62 includes a higher concentration of N-type impurity than the semiconductor substrate 10. A collector electrode 64 is provided on the second principal surface 10B, that is, under the P-type semiconductor layer 63. The collector electrode 64 makes contact with the P-type semiconductor layer 63. The collector electrode 64 may be formed using laminated films of Al, Ti, Ni, and Au which are laminated in this order, downwardly from the P-type semiconductor layer 63, for example. The collector electrode 64 may be formed of other materials, such as laminated films of. Al, Ti, Ni, and Ag which are laminated in this order, downwardly from the P-type semiconductor layer 63.

Each gate trench electrode 41 is drawn out and routed to a vicinity of an outer periphery of the semiconductor device 100, for example, and is connected in common to a gate electrode (or gate pad), which is not illustrated. A shunt (resistor) may be provided between the gate trench electrode 41 and the gate electrode, as appropriate, so that the power supply delay time is uniform throughout the semiconductor device 100. The gate electrode may be formed using aluminum, for example. Each emitter trench electrode 42 is drawn out and routed to a vicinity of the outer periphery of the perimeter of the semiconductor device 100, for example, and is connected to the emitter electrode (or emitter pad) 61.

The P-type semiconductor layer 11 is in an electrically floating state, because the P-type semiconductor layer 11 is not directly connected to the emitter electrode 61, the collector electrode 64, and the gate electrode.

Although not illustrated in the drawings, a so-called guard ring structure is provided on the outer periphery of the semiconductor device 100, in order to maintain a certain withstand voltage (or voltage insulation).

Next, a method for manufacturing the semiconductor device 100 according to the first embodiment will be described. FIG. 3 through FIG. 12 are cross sectional views illustrating the method for manufacturing the semiconductor device 100 according to the first embodiment.

Figure 3:
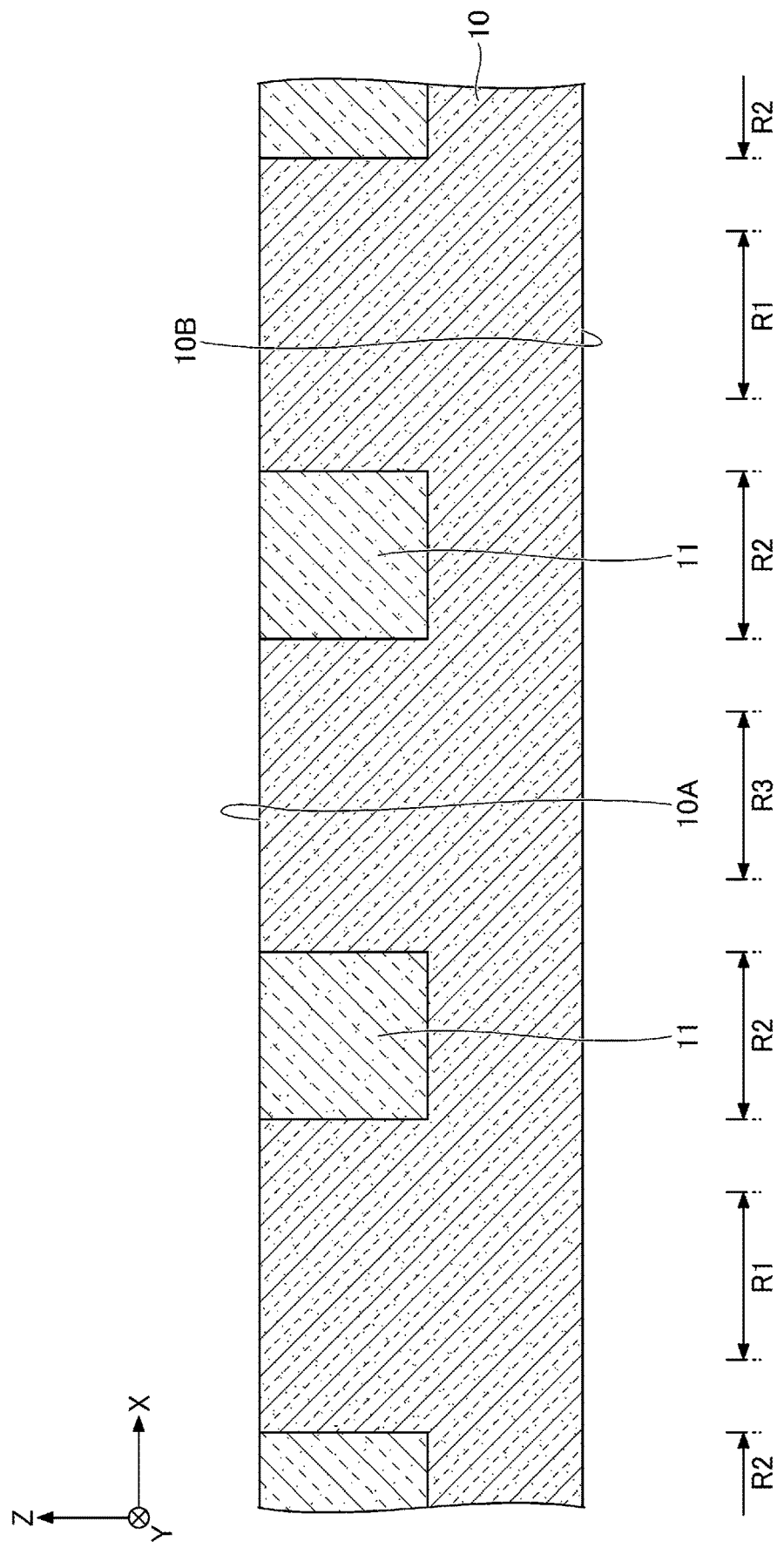
FIG. 3 is a cross sectional view (part 1) illustrating a method for manufacturing the semiconductor device according to the first embodiment.

First, as illustrated in FIG. 3, the semiconductor substrate 10 having the first principal surface 10A, and the second principal surface 10B, is prepared, and the P-type semiconductor layer 11 is formed in the first principal surface 10A in a region which becomes the second region R2, by ion implantation (or injection of ions) of the P-type impurity followed by a heat treatment.

Figure 4:
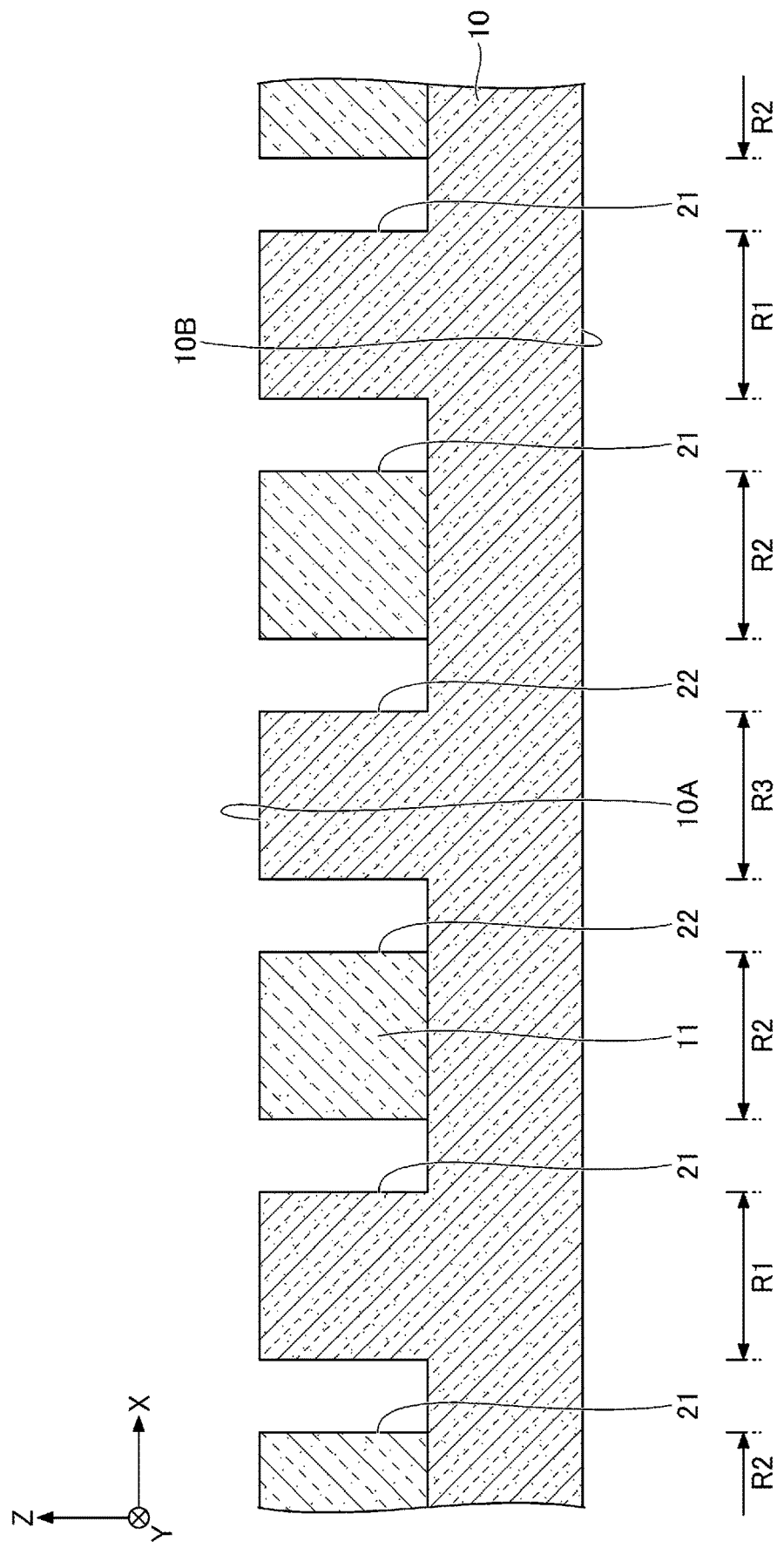
FIG. 4 is a cross sectional view (part 2) illustrating the method for manufacturing the semiconductor device according to the first embodiment.

Next, as illustrated in FIG. 4, the plurality of gate trenches 21 and the plurality of emitter trenches 22 are formed in the first principal surface 10A. When forming the trenches 21 and the trenches 22, a photoresist mask is formed on the first principal surface 10A, and the semiconductor substrate 10 is etched using this photoresist mask, for example. The first region R1 is defined between two trenches 21 that are adjacent to each other in the X-direction, the second region R2 is defined between the trench 21 and the trench 22 that are adjacent to each other in the X-direction, and the third region R3 is defined between two trenches 22 that are adjacent to each other in the X-direction.

Figure 5:
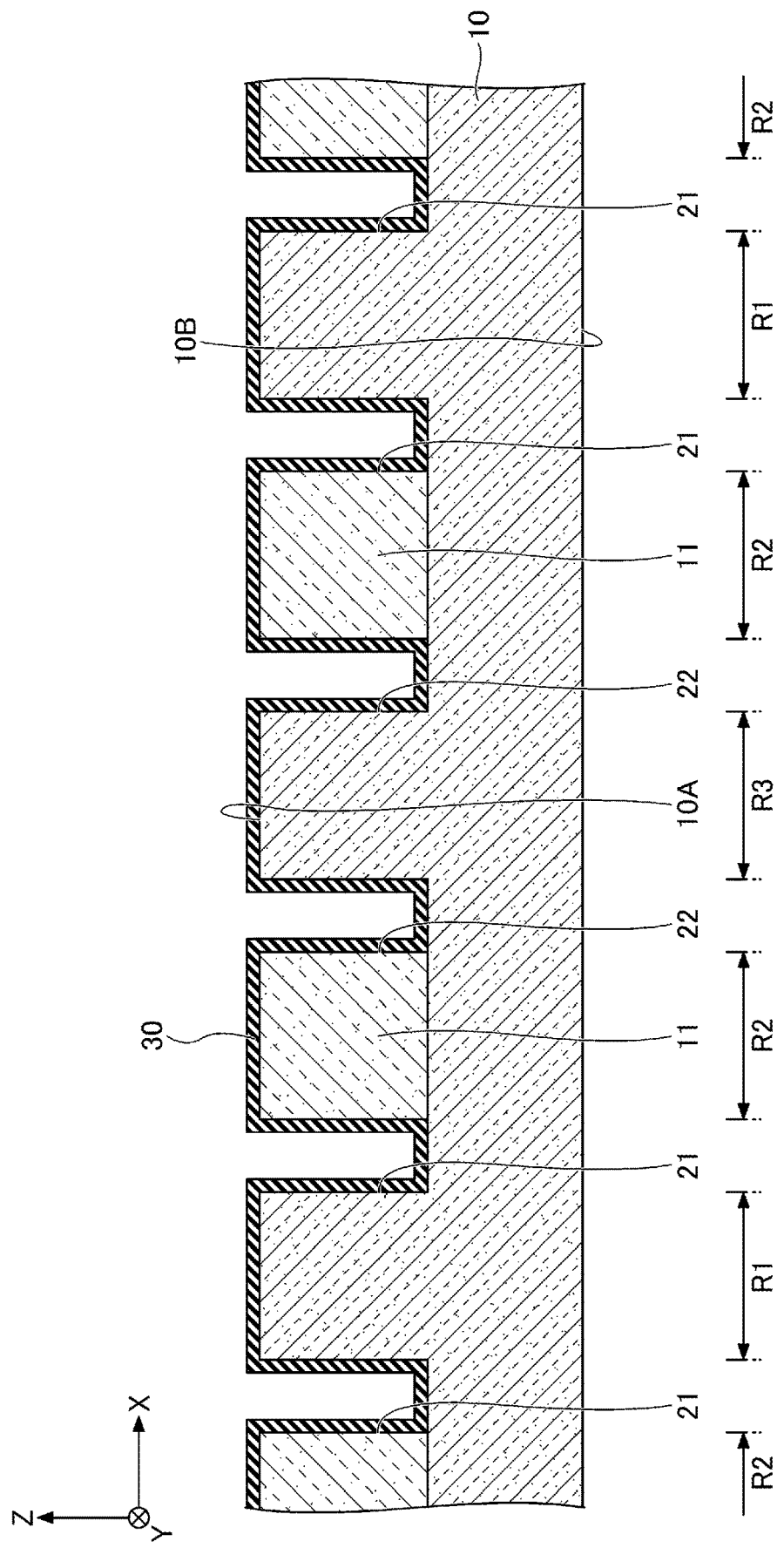
FIG. 5 is a cross sectional view (part 3) illustrating the method for manufacturing the semiconductor device according to the first embodiment.

Next, as illustrated in FIG. 5, the insulating film 30 is formed on the inner walls of the trenches 21 and 22. The insulating film 30 is also formed on the first principal surface 10A. The insulating film 30 may be formed thermal oxidation, for example.

Figure 6:
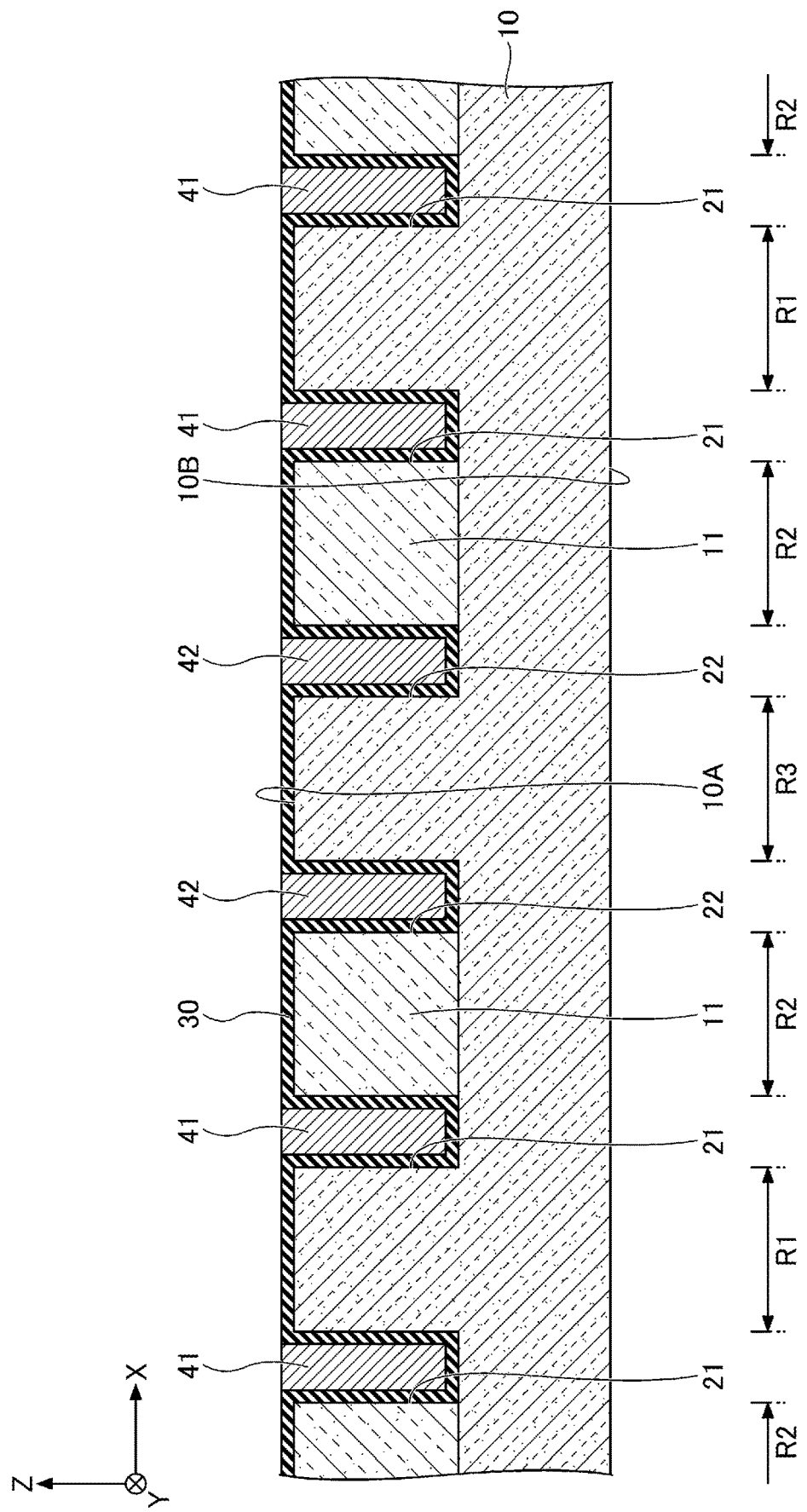
FIG. 6 is a cross sectional view (part 4) illustrating the method for manufacturing the semiconductor device according to the first embodiment.

Next, as illustrated in FIG. 6, the gate trench electrode 41 is formed inside the trench 21 via the insulating film 30, and the emitter trench electrode 42 is formed inside the trench 22 via the insulating film 30.

The P-type semiconductor layer 11 can be formed to a predetermined depth by heating during the formation of the insulating film 30, or the like.

Figure 7:
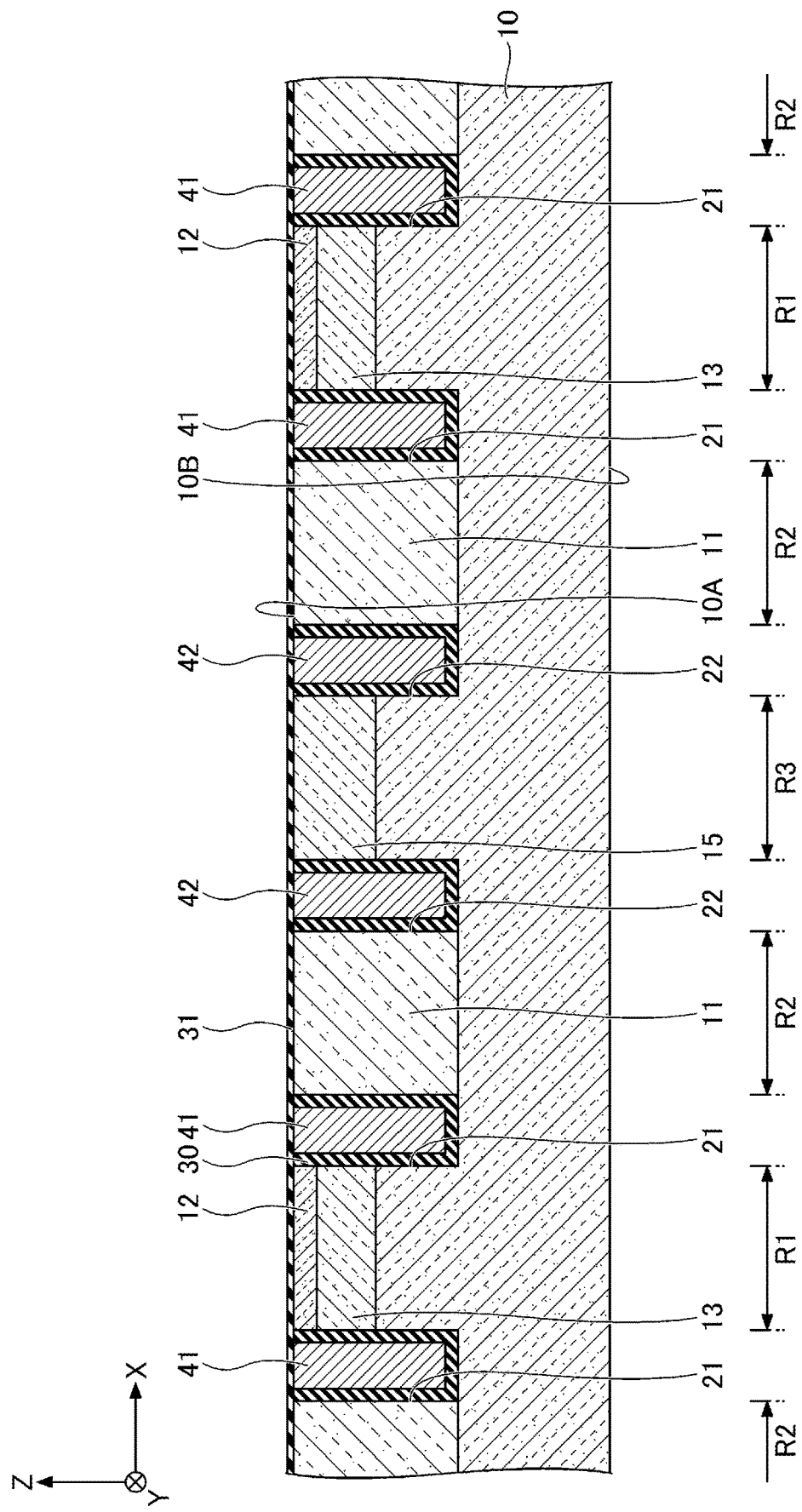
FIG. 7 is a cross sectional view (part 5) illustrating the method for manufacturing the semiconductor device according to the first embodiment.

Next, as illustrated in FIG. 7, the portion of the insulating film 30 on the semiconductor substrate 10, and the portion of the insulating film 30 on the P-type semiconductor layer 11, are removed. That is, the insulating film 30 is removed from above an area where the P-type semiconductor layer 13 and the N-type semiconductor layer 12 are formed in the first region R1, an area where the P-type semiconductor layer 15 is formed in the third region R3, and an area where the P-type semiconductor layer 11 is formed in the second region R2. Then, the insulating film 31 to be implanted with ions is formed on the areas where the insulating film 30 was removed. The insulating film 31 to be implanted with ions is thinner than the insulating film 30. The insulating film 31 may be formed by thermal oxidation, for example. The insulating film 31 is also formed on the gate trench electrode 41 and the emitter trench electrode 42. Thereafter, the P-type semiconductor layer 13 is formed in the first region R1, and the P-type semiconductor layer 15 is formed in the third region R3, by ion implantation of the P-type impurity. The P-type semiconductor layer 13 and the P-type semiconductor layer 15 can be formed simultaneously. The P-type semiconductor layer 13 and the P-type semiconductor layer 15 may be formed in mutually different steps. Next, the N-type semiconductor layer 12 is formed in the first region R1 by implanting the N-type impurity. The insulating film 31 protects the surface of the semiconductor substrate 10 and the P-type semiconductor layer 11 during the ion implantations described above.

Figure 8:
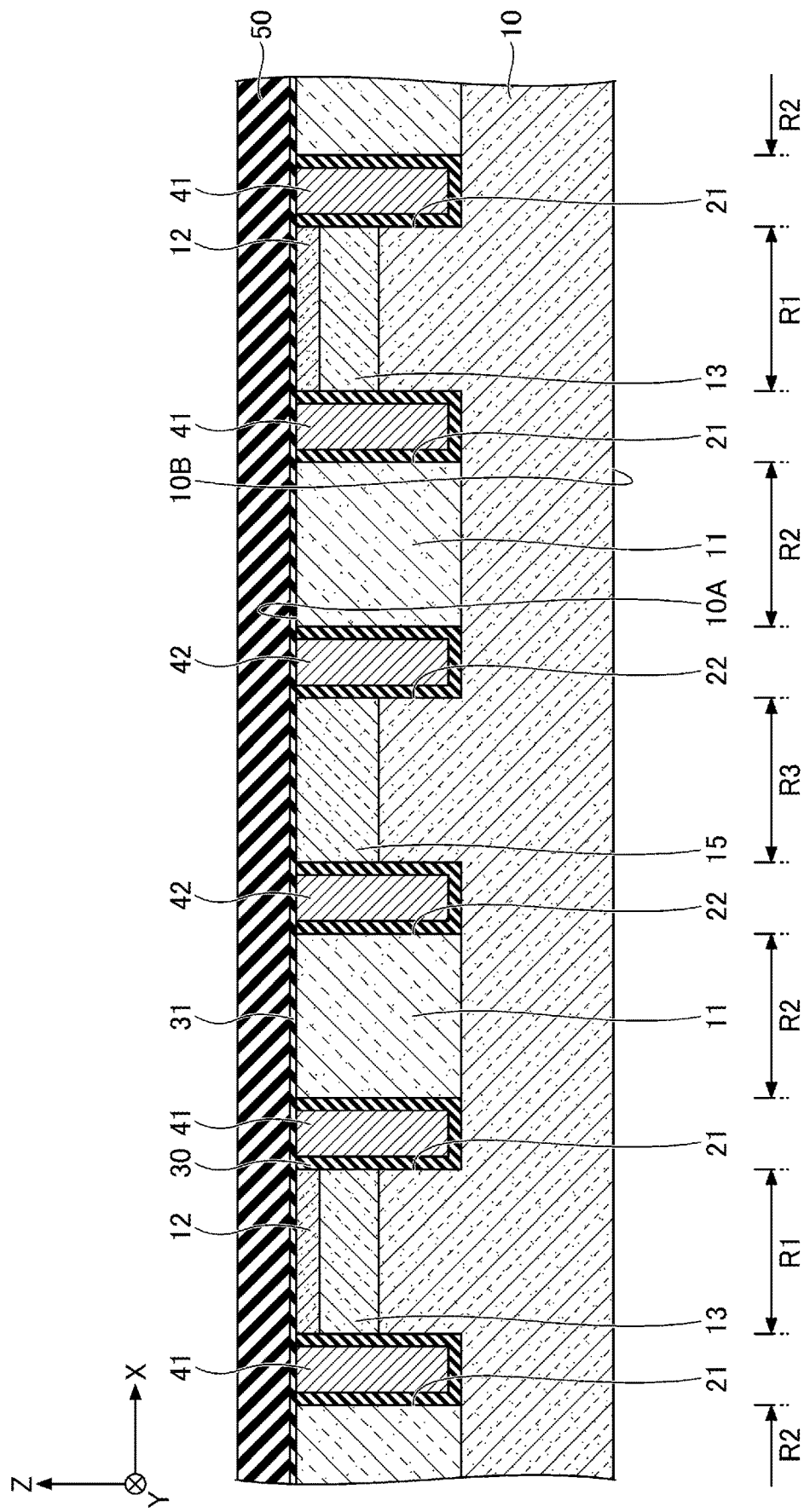
FIG. 8 is a cross sectional view (part 6) illustrating the method for manufacturing the semiconductor device according to the first embodiment.

Next, as illustrated in FIG. 8, the interlayer insulator 50 is formed on the insulating film 31.

Figure 9:
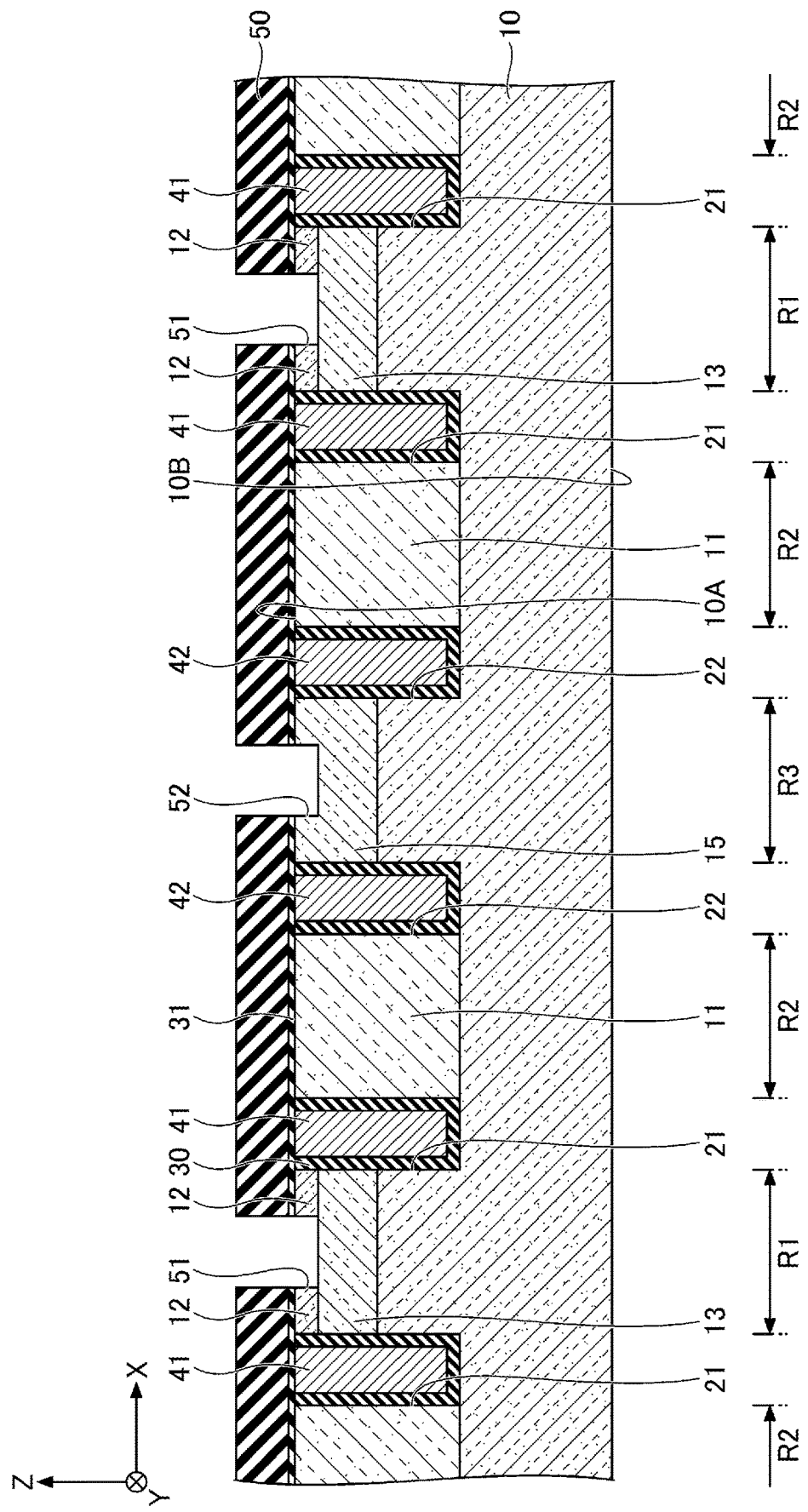
FIG. 9 is a cross sectional view (part 7) illustrating the method for manufacturing the semiconductor device according to the first embodiment.

Next, as illustrated in FIG. 9, the openings 51 reaching the P-type semiconductor layer 13 are formed in the interlayer insulator 50, the insulating film 31, and the N-type semiconductor layer 12, and the opening 52 reaching the P-type semiconductor layer 15 is formed in the interlayer insulator 50 and the insulating film 31. The openings 51 and the opening 52 can be formed simultaneously. When forming the openings 51 and the opening 52, a photoresist mask is formed on the interlayer insulator 50, and the interlayer insulator 50, the insulating film 31, the N-type semiconductor layer 12, and the P-type semiconductor layer 15 are etched using this photoresist mask. The opening 52 may extend into the P-type semiconductor layer 15. The openings 51 may extend into the P-type semiconductor layer 13.

Figure 10:
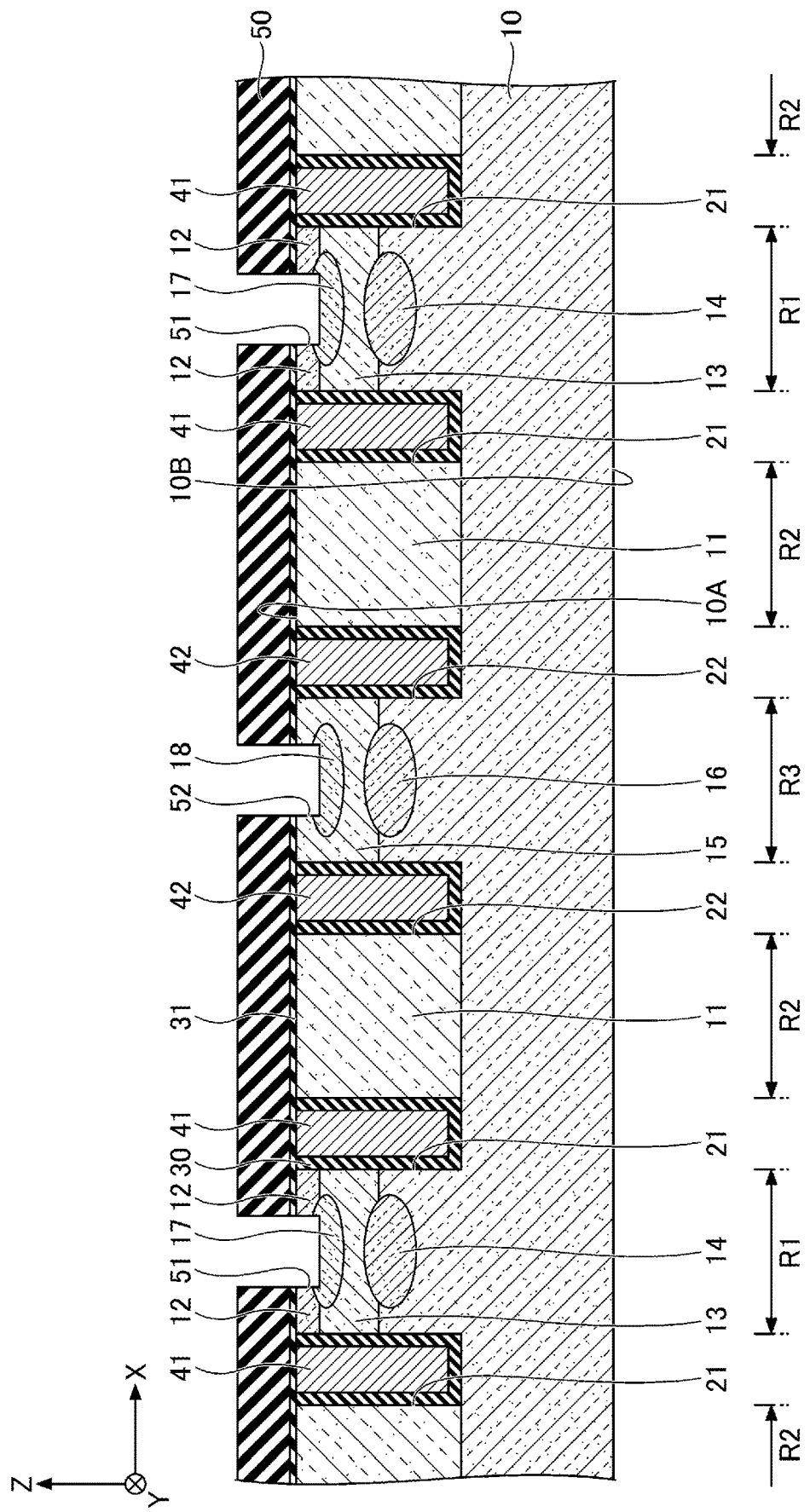
FIG. 10 is a cross sectional view (part 8) illustrating the method for manufacturing the semiconductor device according to the first embodiment.

Next, as illustrated in FIG. 10, the N-type semiconductor layer 14 and the P-type semiconductor layer 17 in the first region R1, and the N-type semiconductor layer 16 and the P-type semiconductor layer 18 in the third region R3, are formed. When forming these semiconductor layers, the ion implantation of the N-type impurity for forming the N-type semiconductor layer 14 and the N-type semiconductor layer 16 are performed in the first region R1 and the third region R3, respectively. Then, the ion implantation of the P-type impurity for forming the P-type semiconductor layer 17 and the P-type semiconductor layer 18 are performed in the first region R1 and the third region R3, respectively. A heat treatment is performed after these ion implantations. Hence, the N-type semiconductor layer 14, the N-type semiconductor layer 16, the P-type semiconductor layer 17, and the P-type semiconductor layer 18 can be formed in this manner. At least a portion of the N-type semiconductor layer 14 overlaps the P-type semiconductor layer 13, and at least a portion of the N-type semiconductor layer 16 overlaps the P-type semiconductor layer 15.

Figure 11:
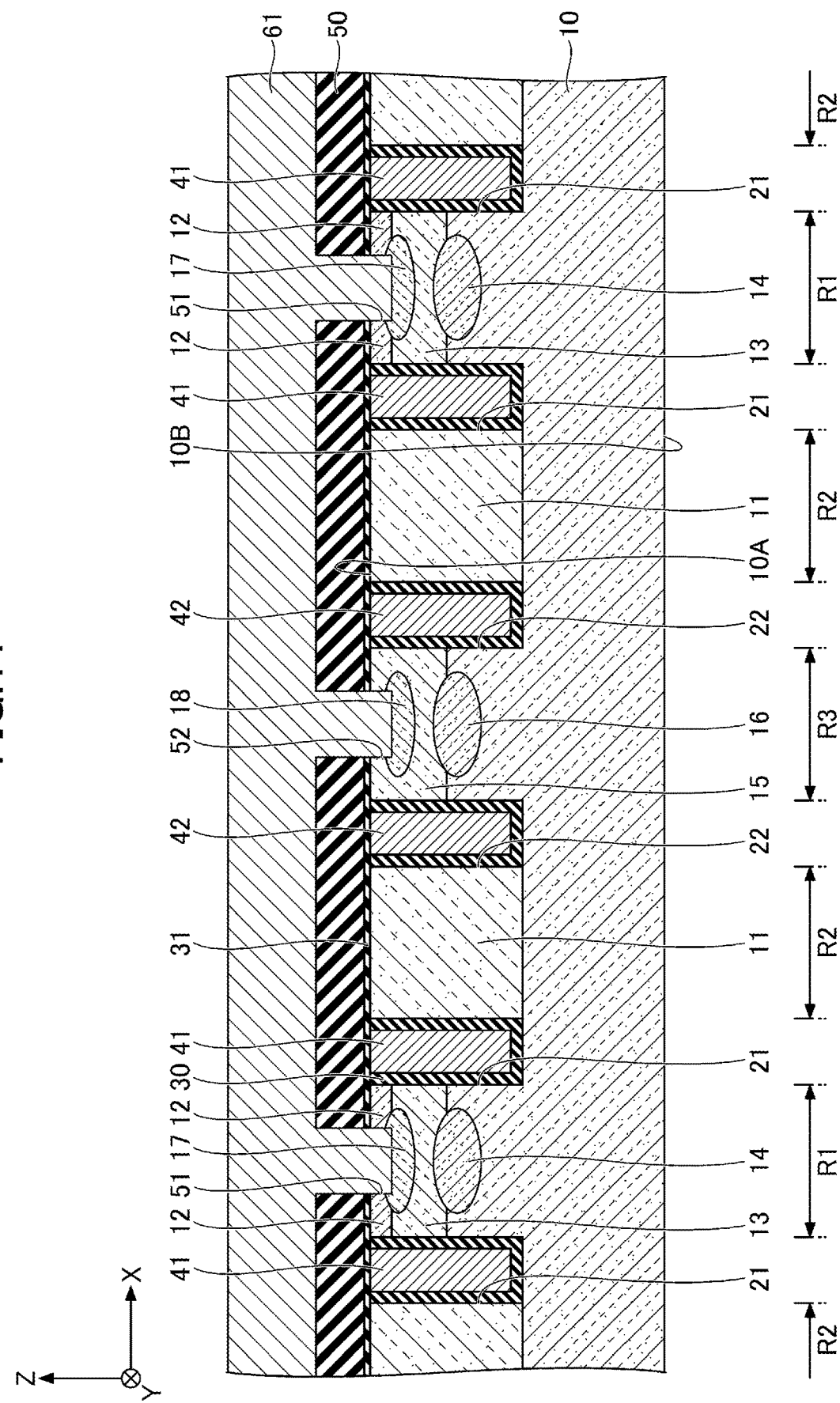
FIG. 11 is a cross sectional view (part 9) illustrating the method for manufacturing the semiconductor device according to the first embodiment.

Next, as illustrated in FIG. 11, the emitter electrode 61 is formed on the interlayer insulator 50. The emitter electrode 61 makes contact with the N-type semiconductor layer 12 and the P-type semiconductor layer 13 through the openings 51, and makes contact with the P-type semiconductor layers 15 and 18 through the opening 52.

Figure 12:
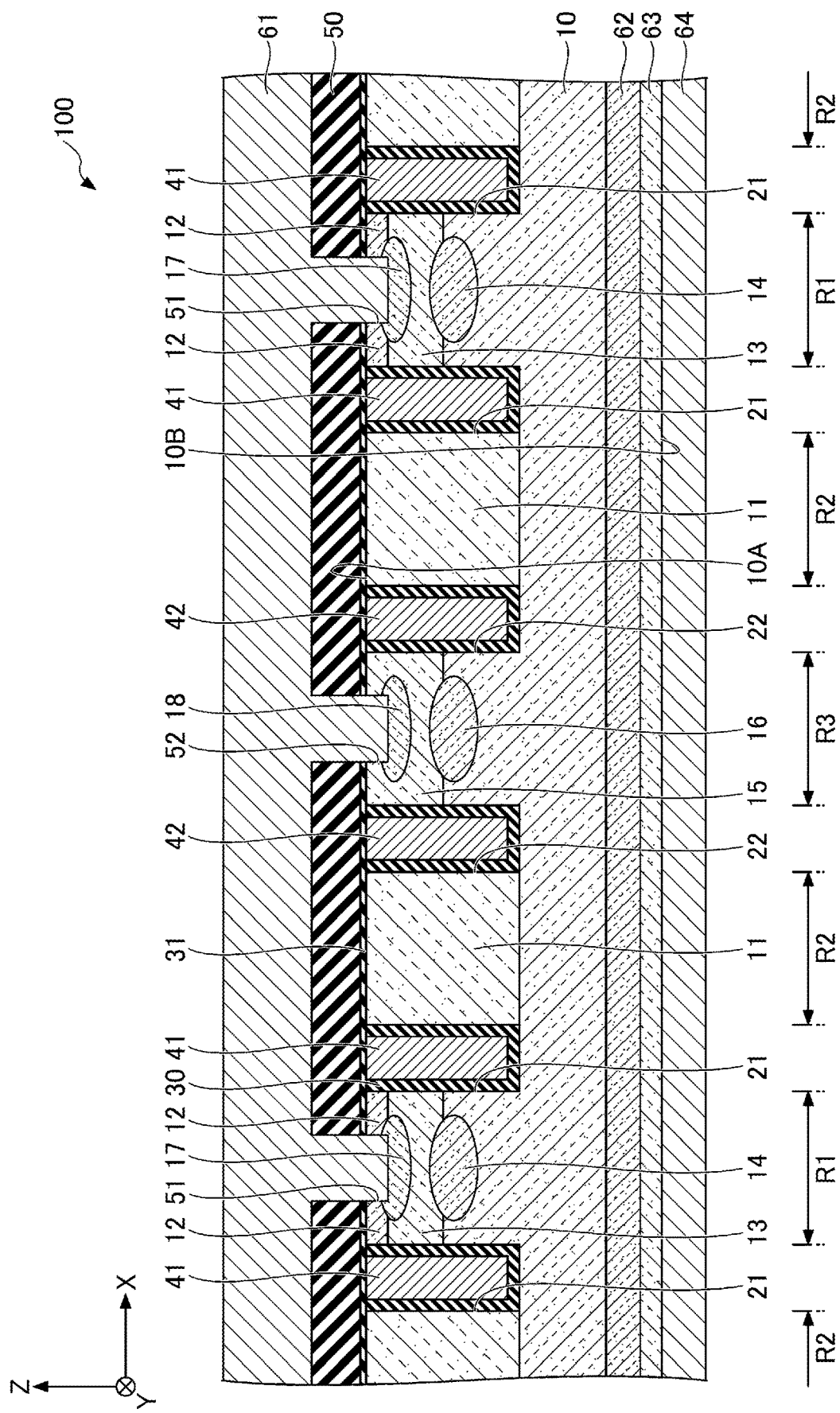
FIG. 12 is a cross sectional view (part 10) illustrating the method for manufacturing the semiconductor device according to the first embodiment.

Next, as illustrated in FIG. 12, the N-type semiconductor layer 62 is formed in the second principal surface 10B by ion implantation of the N-type impurity. In addition, the P-type semiconductor layer 63 is formed in the second principal surface 10B by ion implantation of the P-type impurity. Then, the collector electrode 64 is formed on the second principal surface 10B.

Further, although not illustrated, the gate electrode, which connects to each gate trench electrode 41, is formed.

For example, after forming the P-type semiconductor layer 17, the P-type semiconductor layer 18, the N-type semiconductor layer 14, and the N-type semiconductor layer 16, and before forming the emitter electrode 61, an opening (not illustrated), which reaches the emitter trench electrode 42, may be formed in the interlayer insulator 50 near the outer periphery of the semiconductor device 100. The emitter electrode 61 can connect to the emitter trench electrode 42 through this opening.

Next, advantageous features or effects obtainable by the semiconductor device 100 according to the first embodiment will be described.

In the semiconductor device 100 according to the first embodiment, the N-type semiconductor layer 14 functions as a Hall barrier layer. In addition, the N-type semiconductor layer 14 is separated from the trench 21. Accordingly, characteristics, such as a threshold voltage or the like of the MOS structure of the first region R1, is hardly affected by the N-type semiconductor layer 14. That is, according to the first embodiment, it is possible to reduce the variation in the characteristics of the MOS structure.

The second region R2 is provided adjacent to the first region R1, and the P-type semiconductor layer 11 in the electrically floating state is provided in the second region R2. For this reason, due to the effects of injection enhancement (IE), it is possible to obtain good static properties for the IGBT. In addition, the P-type semiconductor layer 11 and the P-type semiconductor layer 13 can be formed in separate steps, and for example, the P-type semiconductor layer 11 can be formed deeper than the P-type semiconductor layer 13. Accordingly, it is possible to obtain an excellent withstand voltage while obtaining good MOS characteristics in the first region R1.

The third region R3 is provided to sandwich the second region R2 between the first region R1 and the third region R3, and the trench 22 is provided between the second region R2 and the third region R3. In a case where the gate trench electrode 41 is provided inside the trench 22, an increase in a gate capacitance may deteriorate a short-circuit safe operation area (SCSOA) and switching characteristics. In the first embodiment, because the emitter trench electrode 42 connected to the emitter electrode 61 is provided inside the trench 22, it is possible to avoid deterioration of the characteristics caused by the increase in the gate, capacitance.

If the trenches 21 and 22 are not distinguished from each other, the plurality of trenches are equally spaced in the X-direction and formed in the stripe shape in the first principal surface 10A. For this reason, the density of the trenches is highly uniform, and it is possible to reduce the etching variation when forming the trenches. By reducing etching variation, a yield of the semiconductor device 100 can be improved, and further, it is possible to reduce the variation in electrical characteristics.

In the third region R3, the P-type semiconductor layer 15 connected to the emitter electrode 61 is provided to make contact with the N-type semiconductor substrate 10. For this reason, the carrier can be quickly discharged during the switching operation of the IGBT, and the switching characteristics can be improved.

Figure 13:
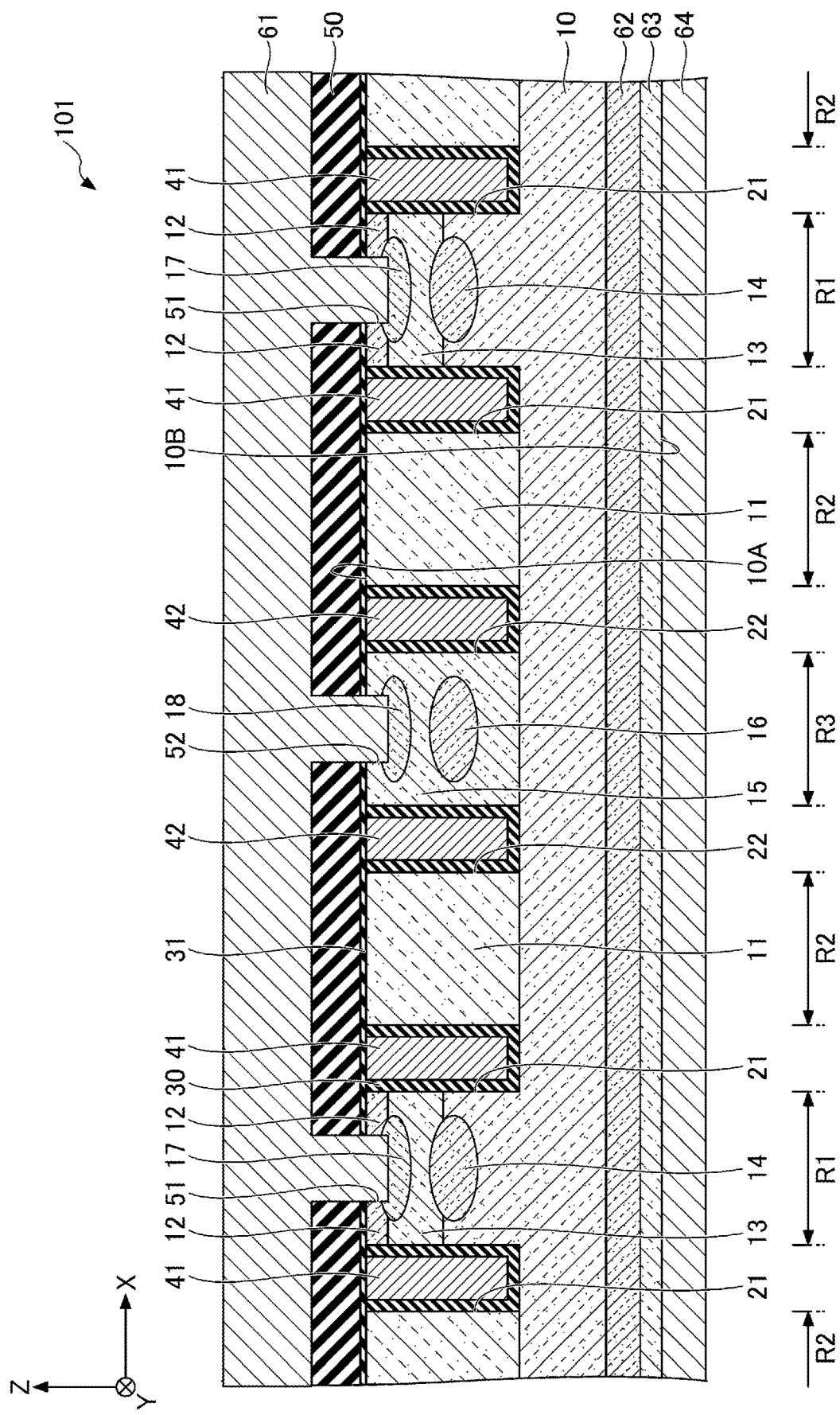
FIG. 13 is a cross sectional view illustrating a semiconductor device according to a modification of the first embodiment.

Moreover, a saturation voltage Vce(sat) can be adjusted according on the depth of the P-type semiconductor layer 15. In the cross sectional view illustrated in FIG. 2, the depth of the P-type semiconductor layer 15 is equal to the depth of the P-type semiconductor layer 13, however, the depth of the P-type semiconductor layer 15 may be greater than the depth of the P-type semiconductor layer 13. FIG. 13 is a cross sectional view illustrating the semiconductor device according to a modification of the first embodiment.

In a semiconductor device 101 according to the modification of the first embodiment, the depth of the P-type semiconductor layer 15 is greater than the depth of the P-type semiconductor layer 13, and is less than or equal to the depth of the P-type semiconductor layer 11. The N-type semiconductor layer 16 is formed so that the entire N-type semiconductor layer 16 overlaps the P-type semiconductor layer 15. Other configurations of this modification are similar to those of the first embodiment.

Figure 14:
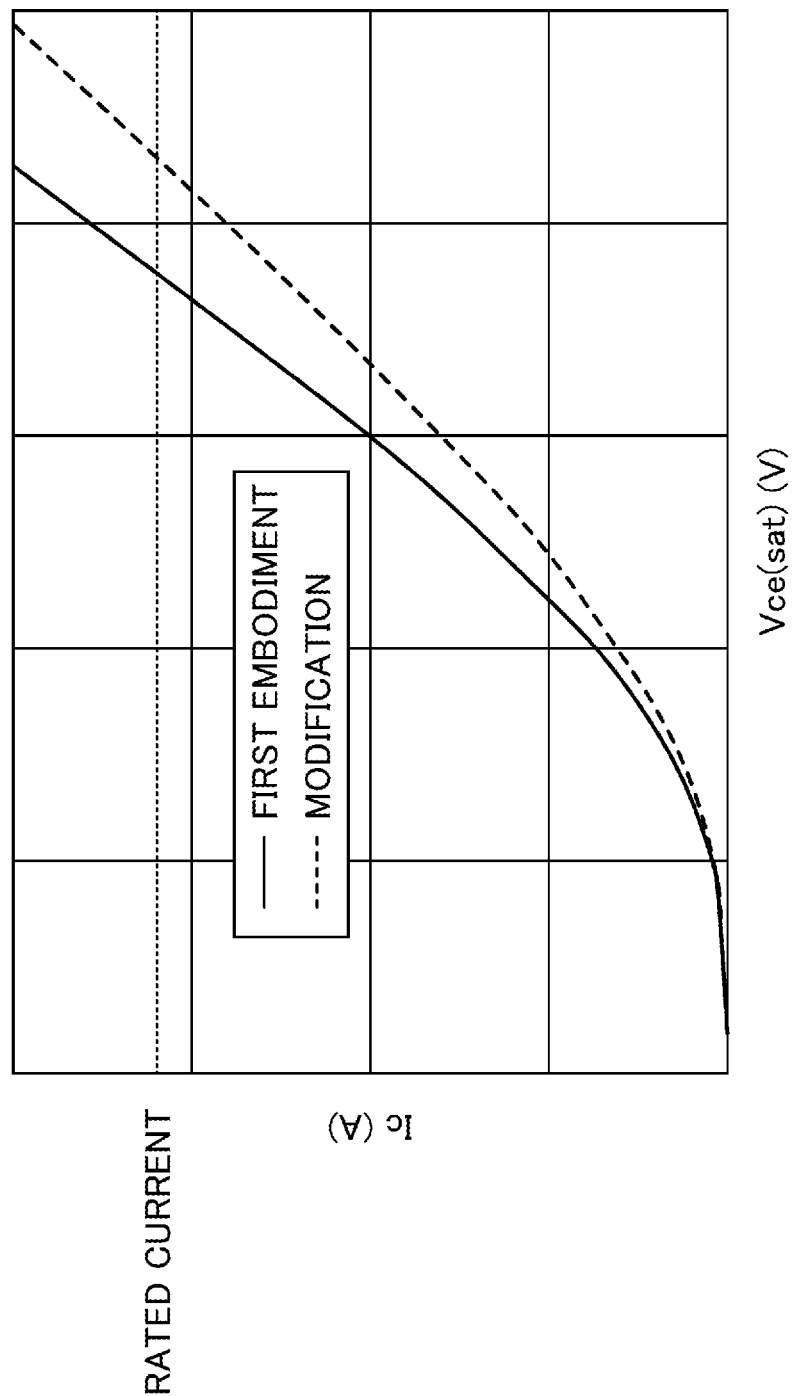
FIG. 14 is a diagram illustrating a Vce-Ic characteristic.

When the semiconductor device 100 and the semiconductor device 101 are compared, the MOS characteristics are essentially the same, and the saturation voltage Vce(sat) of the semiconductor device 100 is lower than the saturation voltage Vce(sat) of the semiconductor device 101. FIG. 14 illustrates results of actual measurements made by the present inventors by making semiconductor devices according to the first embodiment and the modification thereof, and measuring a relationship (Vce-Ic characteristic) between a collector-emitter voltage Vice and a collector current Ic for each of the semiconductor devices according to the first embodiment and the modification thereof. As illustrated in FIG. 14, the threshold voltages of the first embodiment and the modification thereof are essentially the same. On the other hand, the collector-emitter voltage Vce (saturation voltage Vce(sat)) when a rated collector current Ic is applied is smaller for the first embodiment than for the modification thereof.

Figure 15:
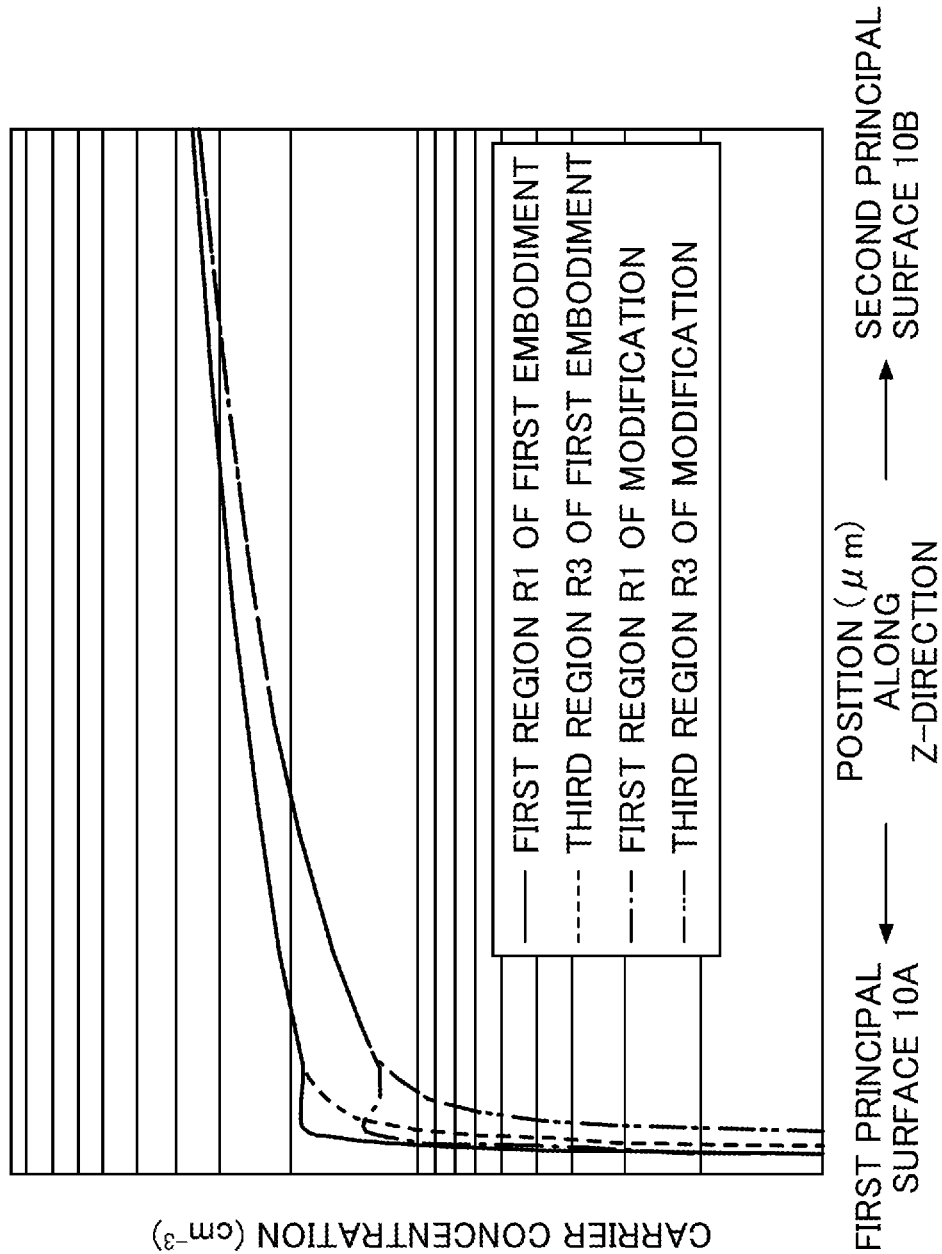
FIG. 15 is a diagram illustrating simulation results related to carrier concentration.

Results of simulation related to carrier concentration performed by the present inventors for the first embodiment and the modification thereof are illustrated in FIG. 15. In this simulation, a hole concentration distribution in the Z-direction was calculated for a portion including the N-type semiconductor layer 14 in a plan view of the first region R1, and a portion including the N-type semiconductor layer 16 in a plan view of the third region R3. A solid line in FIG. 15 indicates the simulation result for the first region R1 of the first embodiment, a dashed line indicates the simulation result for the third region R3 of the first embodiment, a one-dot chain line indicates the simulation result for the first region. R1 of the modification, and a two-dot chain line indicates the simulation result for the third region R3 of the modification.

As illustrated in FIG. 15, in the first embodiment, the simulation results obtained indicate a high hole concentration in both the first region R1 and the third region R3, when compared to the modification. It may be regarded that, because the P-type semiconductor layer 15 is formed to be shallower in the first embodiment when compared to the modification, a kind of carrier accumulation effect is obtained in the first embodiment, thereby resulting in the high hole concentration in both the first region R1 and the third region R3.

Accordingly, the saturation voltage Vce(sat) can be adjusted according to the depth of the P-type semiconductor layer 15, independently of the MOS characteristics. In a case where the depth of the P-type semiconductor layer 15 is equal to the depth of the P-type semiconductor layer 13, the P-type semiconductor layer 15 and the P-type semiconductor layer 13 can be formed simultaneously. On the other hand, by forming the P-type semiconductor layer 15 and the P-type semiconductor layer 13 in separate steps, the saturation voltage Vce(sat) can be adjusted while obtaining the desired MOS characteristics.

The N-type semiconductor layer 16 is preferably separated from the trench 22, because excellent effects of the IE can be obtained, and the saturation voltage Vce(sat) can further be reduced to improve the efficiency of the semiconductor device 100.

The depth of the P-type semiconductor layer 11 is preferably greater than or equal to the depth of the trench 21, because it becomes easier to relax the concentration of the electric field at the lower end of the trench 21.

Second Embodiment

Figure 16:
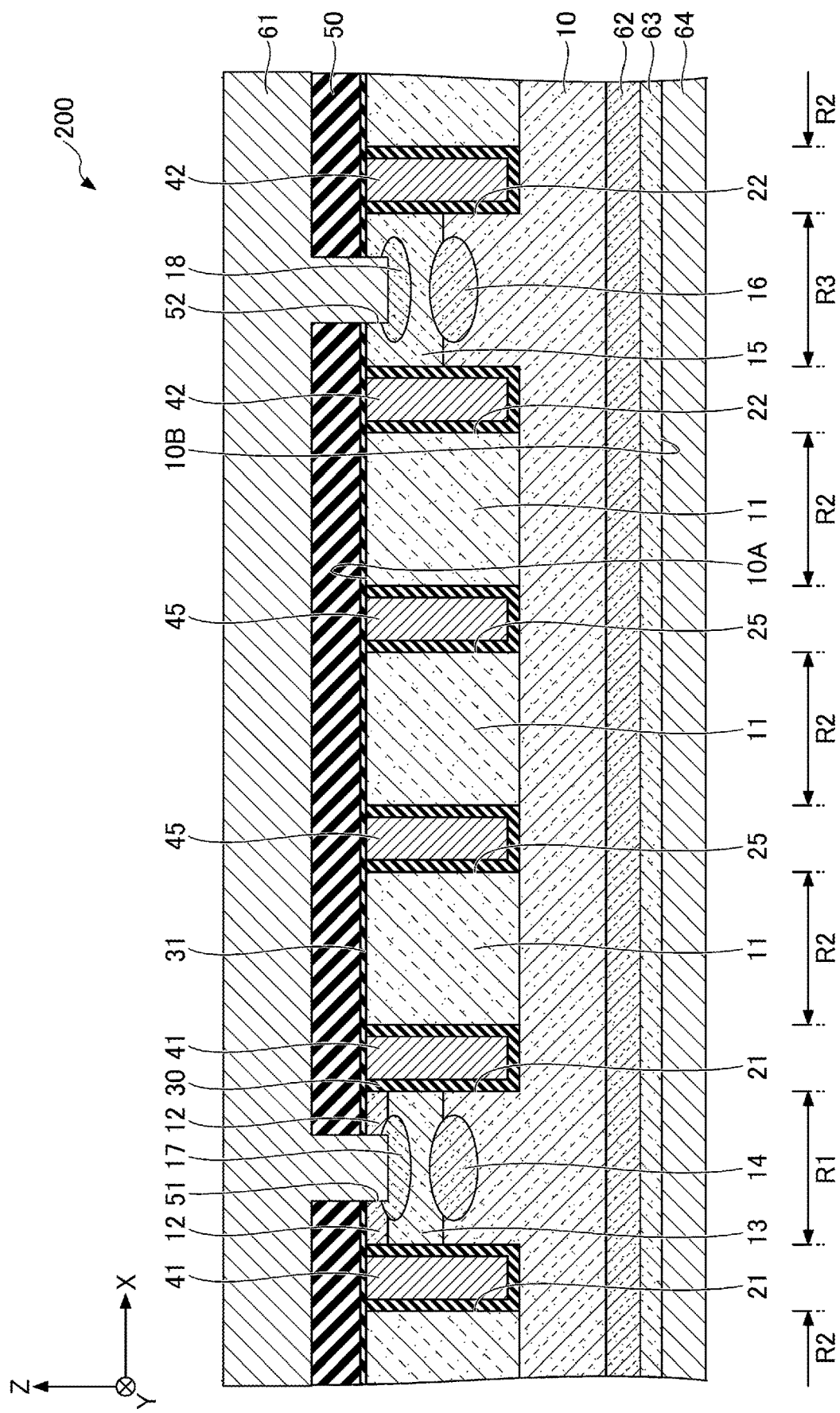
FIG. 16 is a cross sectional view illustrating the semiconductor device according to a second embodiment.

Next, a second embodiment will be described. The second embodiment differs from the first embodiment, mainly in the arrangement of the first region R1, the second region R2, and the third region R3. FIG. 16 is a cross sectional view illustrating the semiconductor device according to the second embodiment.

In a semiconductor device 200 according to the second embodiment, a plurality of emitter trenches 25 are formed in the first principal surface 10A, in addition to the plurality of gate trenches 21 and the plurality of emitter trenches 22. The emitter trenches 25 extend in the Y-direction, for example. Similar to the first embodiment, the pair of trenches 21, and the pair of trenches 22, are alternately arranged in the X-direction. In addition, two trenches 25 are arranged between the pair of trenches 21 and the pair of trenches 22 that are adjacent to each other. The distance between two trenches 21 that are adjacent to each other in the X-direction, the distance between two trenches 22 that are adjacent to each other in the X-direction, a distance between two trenches 25 that are adjacent to each other in the X-direction, a distance between the trenches 21 and 25 that are adjacent to each other in the X-direction, and a distance between the trenches 22 and 25 that are adjacent to each other in the X-direction, are the same. That is, if the trenches 21, 22, and 25 are not distinguished from one another, the plurality of trenches are equally spaced in the X-direction and formed in a stripe shape in the first principal surface 10A. Similar to the first embodiment, the first region R1 is defined between two trenches 21 that are adjacent to each other in the X-direction, and the third region R3 is defined between two trenches 22 that are adjacent to each other in the X-direction. The second region R2 is defined between the trenches 21 and 25 that are adjacent to each other in the X-direction, between two trenches 25 that are adjacent to each other in the X-direction, and between the trenches 25 and 22 that are adjacent to each other in the X-direction. In the second embodiment, the first region R1 and the third region R3 are alternately disposed in the X-direction, with three second regions R2 interposed between the first region R1 and the third region R3, such that the third region R3, the three second regions R2, the first region R1, the three second regions R2, the third region R3, the three second regions R2, the first region R1, . . . , are arranged in the X-direction.

In the second region R2, the P-type semiconductor layer 11 is provided in the first principal surface 10A. The P-type semiconductor layer 11 makes contact with two trenches (trenches 21 and 25, or trenches 25, or trenches 22 and 25) that define the second region R2 in the X-direction.

The insulating film 30 is also provided on the inner wall of trench 25. An emitter trench electrode 45 is provided inside the trench 25 via the insulating film 30. The emitter trench electrode 45 may be formed using polysilicon, for example. Similar to the emitter trench electrode 42, the emitter trench electrode 45 is drawn out and routed to a vicinity of an outer periphery of the semiconductor device 200, for example, and is connected to the emitter electrode (or emitter pad) 61.

Other configurations of the second embodiment are similar to those of the first embodiment.

The second embodiment can also obtain the advantageous features or effects obtainable by the first embodiment. In addition, the effects of the IE can further be improved, and the saturation voltage Vce(sat) can further be reduced to improve the efficiency of the semiconductor device 200.

The number of trenches 25 arranged between the pair of trenches 21 and the pair of trenches 22 that are adjacent to each other is not particularly limited, and the number of trenches 25 may be one or more, and three or more.

Third Embodiment

Figure 17:
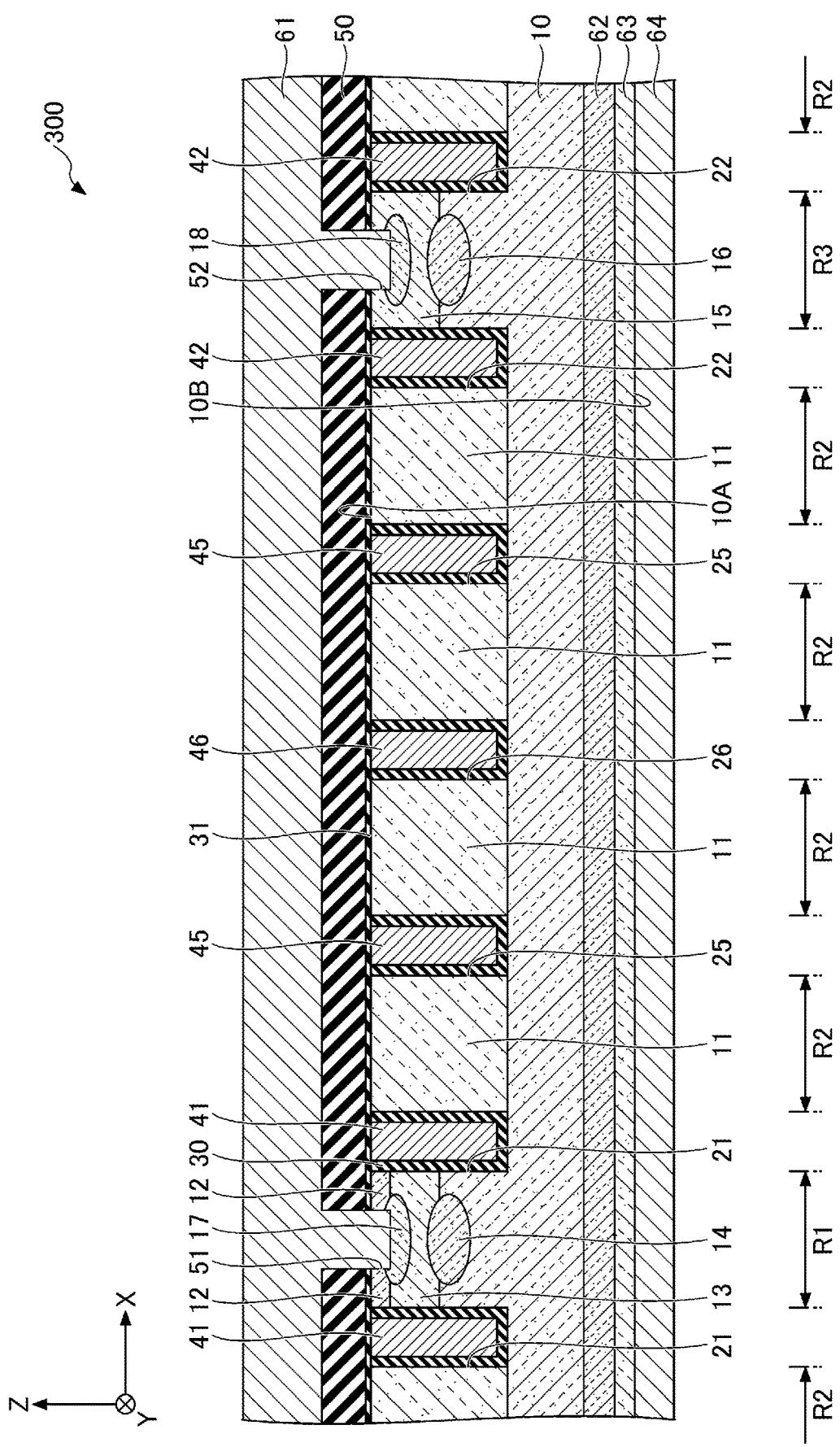
FIG. 17 is a cross sectional view illustrating the semiconductor device according to a third embodiment.

Next, a third embodiment will be described. The third embodiment differs from the second embodiment, mainly in the arrangement of the first region R1, the second region R2, and the third region R3. FIG. 17 is a cross sectional view illustrating the semiconductor device according to the third embodiment.

In a semiconductor device 300 according to the third embodiment, a plurality of gate trenches 26 are formed in the first principal surface 10A in addition to the Plurality of gate trenches 21, the plurality of emitter trenches 22, and the plurality of emitter trenches 25. The trenches 26 extend in the Y-direction, for example. Similar to the second embodiment, the pair of trenches 21 and the pair of trenches 22 are alternately arranged in the X-direction. In addition, two trenches 25 are arranged between the pair of trenches 21 and the pair of trenches 22 that are adjacent to each other. Further, one trench 26 is arranged between the two trenches 25 that are adjacent to each other. The distance between two trenches 21 adjacent to each other in the X-direction, the distance between two trenches 22 adjacent to each other in the X-direction, the distance between the trenches 21 and 25 adjacent to each other the X-direction, a distance between the trenches 25 and 26 adjacent to each other in the X-direction, and the distance between the trenches 22 and 25 adjacent to each other in the X-direction, are the same. That is, if the trenches 21, 22, 25, and 26 are not distinguished from one another, the plurality of trenches are equally spaced in the X-direction and formed in a stripe shape in the first principal surface 10A. Similar to the second embodiment, the first region R1 is defined between two trenches 21 adjacent to each other in the X-direction, and the third region R3 is defined between two trenches 22 adjacent to each other in the X-direction. The second region R2 is defined between the trenches 21 and 25 adjacent to each other in the X-direction, between two trenches 25 adjacent to each other in the X-direction, between the trenches 25 and 26 adjacent to each other in the X-direction, and between the trenches 26 and 22 adjacent to each other in the X-direction. In the third embodiment, the first region R1 and the third region R3 are alternately disposed in the X-direction, with four second regions R2 interposed between the first region R1 and the third region R3, such that the third region R3, the four second regions R2, the first region R1, the four second regions R2, the third region R3, the four second regions R2, the first region R1, . . . , are arranged in the X-direction.

In the second region R2, the P-type semiconductor layer 11 is provided in the first principal surface 10A. The P-type semiconductor layer 11 makes contact with two trenches (trenches 21 and 25, or trenches 25 and 26, or trenches 22 and 25) that define the second region R2 in the X-direction.

The insulating film 30 is also provided on the inner wall of trench 26. A gate trench electrode 46 is provided inside the trench 26 via the insulating film 30. The gate trench electrode 46 may be formed using polysilicon, for example. Similar to the gate trench electrode 41, the gate trench electrode 46 is drawn out and routed to a vicinity of an outer periphery of the semiconductor device 300, for example, and is connected to the gate electrode (or gate pad), which is not illustrated.

Other configurations of the third embodiment are similar to those of the second embodiment.

The third embodiment can also obtain the advantageous features or effects obtainable by the second embodiment. In addition, the input capacitance can be increased while avoiding the increase of the gate capacitance in the MOS structure affecting the properties of the IGBT. Hence, the gate noise can be reduced.

According to each of the embodiments of the present disclosure, it is possible to easily adjust the saturation voltage, and reduce the variation in the characteristics.

Although the embodiments are numbered with, for example, "first," "second," and "third," the ordinal numbers do not imply priorities of the embodiments.

Further, the present invention is not limited to these embodiments, but various variations, modifications, and substitutions of a part or all of the embodiments may be made without departing from the scope of the present invention.

What is claimed is:

1. A semiconductor device comprising:
  a semiconductor substrate of a first conductivity type, having a first principal surface, and a second principal surface on an opposite side from the first principal surface;

a first trench provided in the first principal surface;
a second trench provided in the first principal surface;
a third trench provided in the first principal surface;
a fourth trench provided in the first principal surface;
a first semiconductor layer of a second conductivity type, provided in the first principal surface between the first trench and the second trench;
a second semiconductor layer of the first conductivity type, provided in the first principal surface at a position sandwiching the first trench between the second semiconductor layer and the first semiconductor layer, and making contact with the first trench;
a third semiconductor layer of the second conductivity type, provided under the second semiconductor layer, and making contact with the second semiconductor layer and the first trench;
a fourth semiconductor layer of the first conductivity type, provided under the third semiconductor layer, and making contact with the third semiconductor layer but separated from the first trench;
a fifth semiconductor layer of the second conductivity type, provided in the first principal surface at a position sandwiching the second trench between the fifth semiconductor layer and the first semiconductor layer;
a sixth semiconductor layer of the first conductivity type provided on the third semiconductor layer, making contact with the third semiconductor layer and the third trench, separated from the second semiconductor layer, and connected to the emitter electrode;
a first insulating film provided on an inner wall of the first trench;
a first gate trench electrode provided inside the first trench via the first insulating film, and opposing the third semiconductor layer;
a second insulating film provided on an inner wall of the second trench;
a first emitter trench electrode provided inside the second trench via the second insulating film;
a third insulating film provided on an inner wall of the third trench;
a second gate trench electrode provided inside the third trench via the third insulating film, opposing the third semiconductor layer, and connected to the gate electrode;
a fourth insulating film provided on an inner wall of the fourth trench;
a second emitter trench electrode provided inside the fourth trench via the fourth insulating film, and connected to the emitter electrode;
a gate electrode connected to the first gate trench electrode;
an emitter electrode connected to the first emitter trench electrode, the second semiconductor layer, the third semiconductor layer, and the fifth semiconductor layer; and
a collector electrode provided in the second principal surface, wherein
the first semiconductor layer is in an electrically floating state,
the first trench is arranged between the second trench and the third trench,
the second trench is arranged between the first trench and the fourth trench,
the third semiconductor layer makes contact with the third trench,
the fourth semiconductor layer is separated from the third trench, the fifth semiconductor layer makes contact with the fourth trench, and
the third trench, the first trench, the second trench, and the fourth trench are equally spaced and formed in a stripe shape along a predetermined direction.

2. The semiconductor device as claimed in claim 1, further comprising:
a seventh semiconductor layer of the first conductivity type, provided under the fifth semiconductor layer, and making contact with the fifth semiconductor layer.

3. The semiconductor device as claimed in claim 2, wherein the seventh semiconductor layer is separated from the second trench.

4. The semiconductor device as claimed in claim 1, wherein a depth of the first semiconductor layer is greater than or equal to a depth of the first trench.

5. The semiconductor device as claimed in claim 1, wherein a depth of the fifth semiconductor layer is equal to a depth of the third semiconductor layer.

6. The semiconductor device as claimed in claim 1, wherein a depth of the fifth semiconductor layer is greater than a depth of the third semiconductor layer, and is less than or equal to a depth of the first semiconductor layer.

7. The semiconductor device as claimed in claim 1, further comprising:
a fifth trench provided in the first principal surface at a position between the first trench and the second trench;
a fifth insulating film provided on an inner wall of the fifth trench;
a third emitter trench electrode provided inside the fifth trench via the fifth insulating film, and connected to the emitter electrode, wherein
the first semiconductor layer is provided between the first trench and the fifth trench that are adjacent to each other, and between the second trench and the fifth trench that are adjacent to each other, and
the first trench, the fifth trench, and the second trench are equally spaced and formed in a stripe shape along the predetermined direction.

8. The semiconductor device as claimed in claim 7, wherein
a plurality of fifth trenches are provided in the first principal surface between the first trench and the second trench,
the fifth insulating film and the third emitter trench electrode are provided for each of the plurality of fifth trenches,
the first semiconductor layer is provided between two fifth trenches that are adjacent to each other, and
the first trench, the plurality of fifth trenches, and the second trench are equally spaced and formed in a stripe shape along the predetermined direction.

9. The semiconductor device as claimed in claim 8, further comprising:
a sixth trench provided in the first principal surface between two fifth trenches that are adjacent to each other;
a sixth insulating film provided on an inner wall of the sixth trench; and
a third gate trench electrode provided inside the sixth trench via the sixth insulating film, and connected to the gate electrode, wherein
the first semiconductor layer is provided between the fifth trench and the sixth trench that are adjacent to each other, and the plurality of fifth trenches, and the sixth trench are equally spaced and formed in a stripe shape along the predetermined direction.

10. A method for manufacturing a semiconductor device, comprising:

forming a first trench, a second trench, a third trench, and a fourth trench in a first principal surface of a semiconductor substrate of a first conductivity type having the first principal surface and a second principal surface on an opposite side from the first principal surface;

forming a first semiconductor layer of a second conductivity type in the first principal surface between the first trench and the second trench;

forming a second semiconductor layer of the first conductivity type in the first principal surface, making contact with the first trench, at a position sandwiching the first trench between the second semiconductor layer and the first semiconductor layer;

forming a third semiconductor layer of the second conductivity type under the second semiconductor layer, making contact with the second semiconductor layer and the first trench;

forming a fourth semiconductor layer of the first conductivity type under the third semiconductor layer, making contact with the third semiconductor layer but separated from the first trench;

forming a fifth semiconductor layer of the second conductivity type in the first principal surface at a position sandwiching the second trench between the fifth semiconductor layer and the first semiconductor layer;

forming a sixth semiconductor layer of the first conductivity type provided on the third semiconductor layer, making contact with the third semiconductor layer and the third trench, separated from the second semiconductor layer, and connected to the emitter electrode;

forming a first insulating film on an inner wall of the first trench;

forming a first gate trench electrode inside the first trench via the first insulating film, and opposing the third semiconductor layer;

forming a second insulating film on an inner wall of the second trench;

forming a first emitter trench electrode inside the second trench via the second insulating film;

forming a third insulating film on an inner wall of the third trench;

forming a second gate trench electrode inside the third trench via the third insulating film, opposing the third semiconductor layer, and connected to the gate electrode;

forming a fourth insulating film on an inner wall of the fourth trench;

forming a second emitter trench electrode inside the fourth trench via the fourth insulating film, and connected to the emitter electrode;

forming a gate electrode connected to the first gate trench electrode;

forming an emitter electrode connected to the first emitter trench electrode, the second semiconductor layer, the third semiconductor layer, and the fifth semiconductor layer; and forming a collector electrode in the second principal surface, wherein the first semiconductor layer is in an electrically floating state, the first trench is arranged between the second trench and the third trench, the second trench is arranged between the first trench and the fourth trench, the third semiconductor layer makes contact with the third trench, the fourth semiconductor layer is separated from the third trench, the fifth semiconductor layer makes contact with the fourth trench, and the third trench, the first trench, the second trench, and the fourth trench are equally spaced and formed in a stripe shape along a predetermined direction.

11. The method for manufacturing the semiconductor device as claimed in claim 10, further comprising:

forming an insulating film on the second semiconductor layer and the fifth semiconductor layer, before forming the emitter electrode;

forming a first opening, reaching the third semiconductor layer, in the insulating film and the second semiconductor layer; and forming a second opening, reaching the fifth semiconductor layer, in the insulating film, wherein the emitter electrode is connected to the second semiconductor layer and the third semiconductor layer through the first opening, and is connected to the fifth semiconductor layer through the second opening.

12. The method for manufacturing the semiconductor device as claimed in claim 11, wherein the forming the fourth semiconductor layer includes ion implantation of an impurity of the first conductivity type through the first opening.

13. The method for manufacturing the semiconductor device as claimed in claim 12, wherein ion implantation of the impurity of the first conductivity type forms a seventh semiconductor layer of the first conductivity type having at least a portion thereof overlapping the fifth semiconductor layer.

14. The method for manufacturing the semiconductor device as claimed in claim 13, wherein the seventh semiconductor layer is separated from the second trench.

* * * * *